United States Patent
Su et al.

(10) Patent No.: US 11,348,929 B2
(45) Date of Patent: May 31, 2022

(54) MEMORY DEVICE AND METHOD FOR FORMING THE SAME

(71) Applicant: TAIWAN SEMICONDUCTOR MANUFACTURING CO., LTD., Hsinchu (TW)

(72) Inventors: Hsin-Wen Su, Yunlin County (TW); Chia-En Huang, Hsinchu County (TW); Shih-Hao Lin, Hsinchu (TW); Lien-Jung Hung, Taipei (TW); Ping-Wei Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 65 days.

(21) Appl. No.: 17/035,298

(22) Filed: Sep. 28, 2020

(65) Prior Publication Data
US 2022/0102368 A1   Mar. 31, 2022

(51) Int. Cl.
| | |
|---|---|
| *H01L 27/11521* | (2017.01) |
| *H01L 23/522* | (2006.01) |
| *H01L 27/11568* | (2017.01) |
| *G11C 7/18* | (2006.01) |
| *H01L 29/872* | (2006.01) |
| *G11C 8/14* | (2006.01) |

(52) U.S. Cl.
CPC ......... *H01L 27/11521* (2013.01); *G11C 7/18* (2013.01); *G11C 8/14* (2013.01); *H01L 23/5226* (2013.01); *H01L 27/11568* (2013.01); *H01L 29/872* (2013.01)

(58) Field of Classification Search
CPC ......... H01L 27/11521; H01L 27/11568; H01L 23/5226; H01L 29/872; G11C 7/18; G11C 8/14
USPC ......................................................... 257/314
See application file for complete search history.

(56) References Cited

U.S. PATENT DOCUMENTS

| | | | |
|---|---|---|---|
| 8,619,465 B2 * | 12/2013 | Chang ................... | G11C 11/412 365/154 |
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |

(Continued)

*Primary Examiner* — Tu-Tu V Ho
(74) *Attorney, Agent, or Firm* — Birch, Stewart, Kolasch & Birch, LLP

(57) ABSTRACT

A memory device includes a substrate, a first gate structure and a second gate structure, first, second, third source/drain structures, gate spacers, a first via and a second via, and a semiconductor layer. The first gate structure and the second gate structure are over the substrate. The first, second, third source/drain structures are over the substrate, in which the first and second source/drain structures are on opposite sides of the first gate structure, the second and third source/drain structures are on opposite sides of the second gate structure. The gate spacers are on opposite sidewalls of the first and second gate structures. The first via and the second via are over the first gate structure and the second gate structure, respectively, in which the first via is in contact with the first gate structure. The semiconductor layer is between the second via and the second gate structure.

20 Claims, 45 Drawing Sheets

(56) References Cited

U.S. PATENT DOCUMENTS

| | | |
|---|---|---|
| 9,576,814 B2 | 2/2017 | Wu et al. |
| 9,831,183 B2 | 11/2017 | Lin et al. |
| 9,859,386 B2 | 1/2018 | Ho et al. |

* cited by examiner

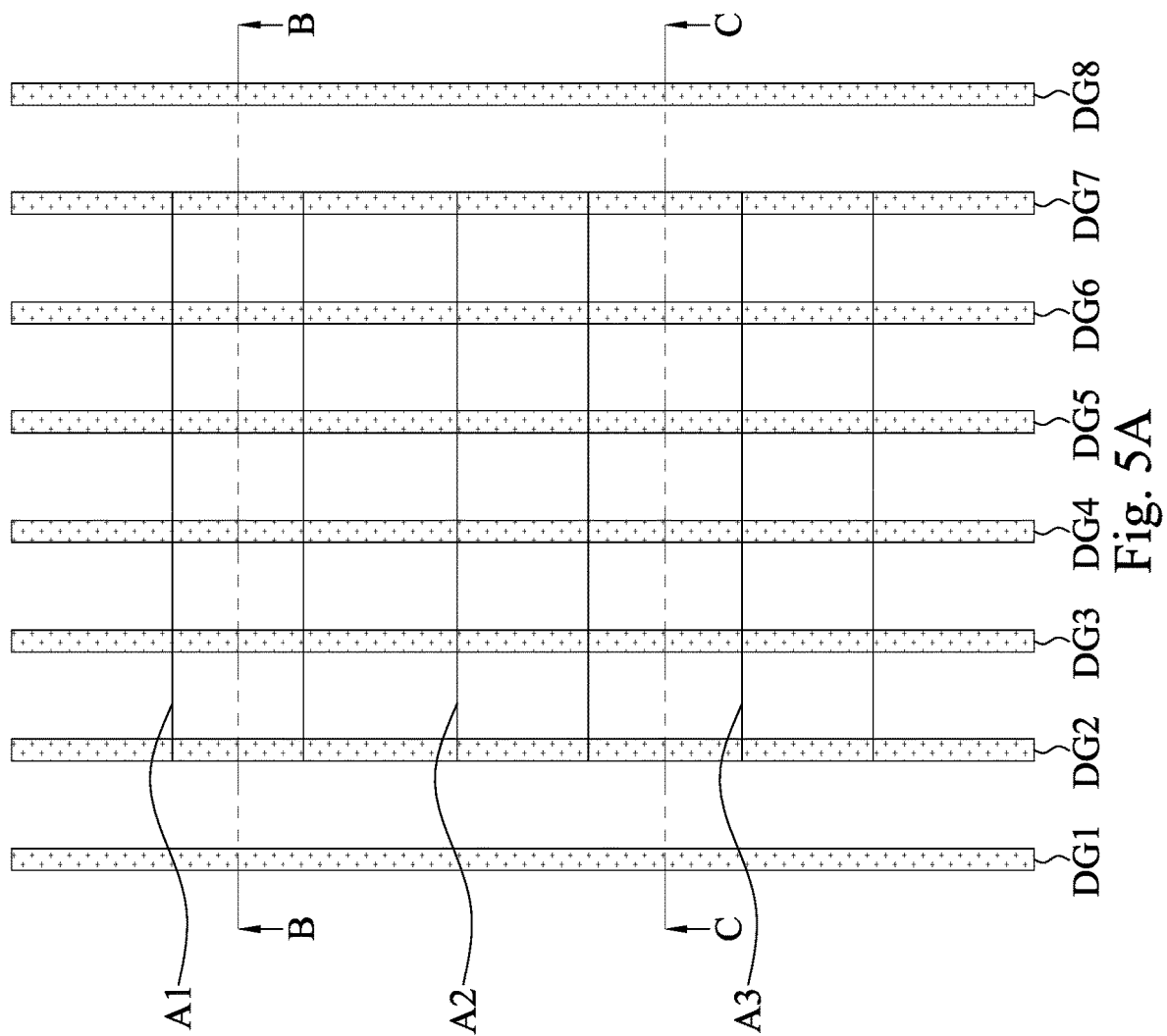

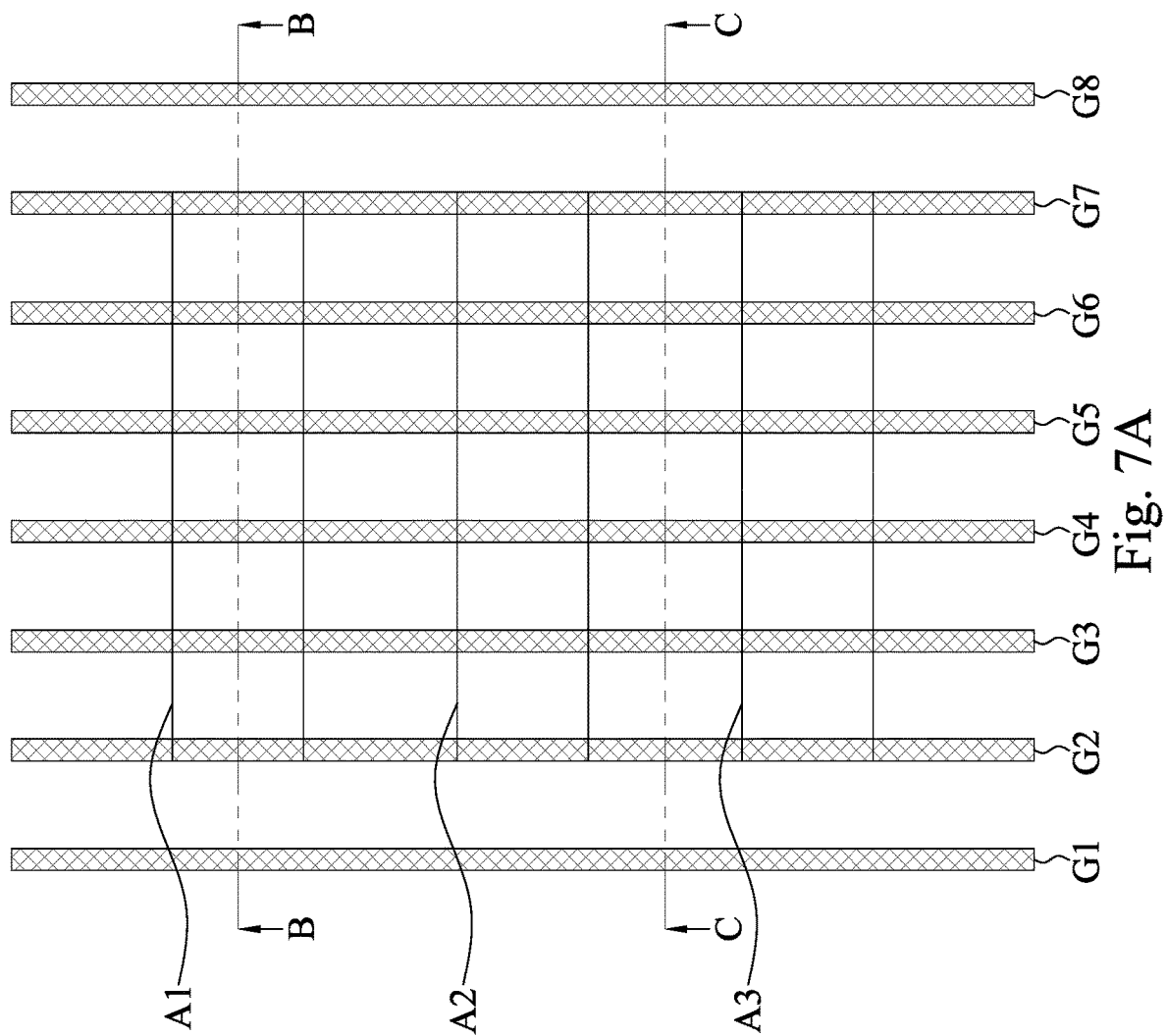

MEMORY DEVICE AND METHOD FOR FORMING THE SAME

BACKGROUND

Integrated circuits (ICs) sometimes include one-time-programmable ("OTP") memory elements to provide non-volatile memory ("NVM") in which data are not lost when the IC is powered off. One type of NVM includes an anti-fuse bit integrated into an IC by using a layer of dielectric material (oxide, etc.) connected to other circuit elements. To program an anti-fuse bit, a programming electric field is applied across the dielectric material layer to sustainably alter (e.g., break down) the dielectric material, thus decreasing the resistance of the dielectric material layer. Typically, to determine the status of an anti-fuse bit, a read voltage is applied across the dielectric material layer and a resultant current is read.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
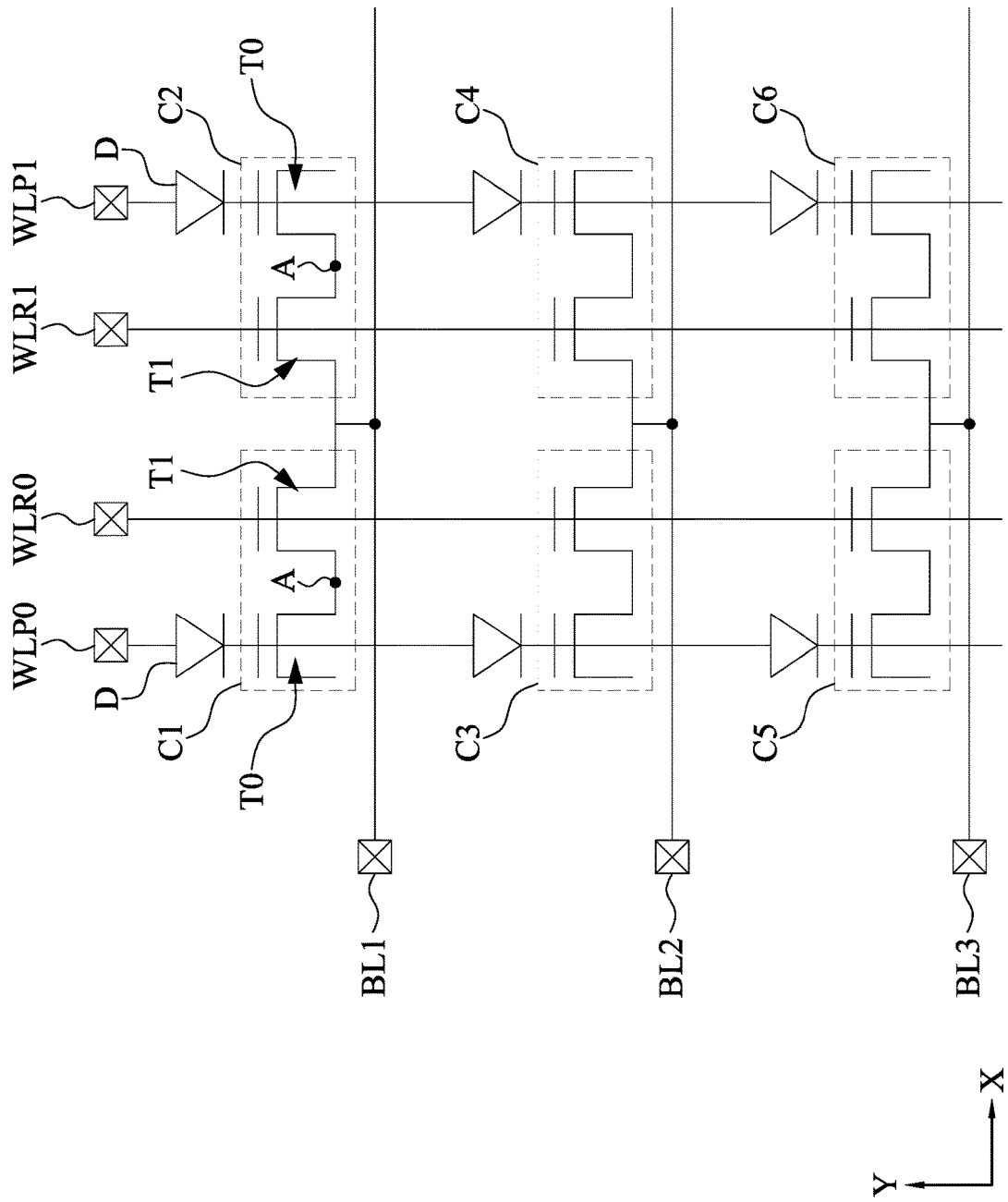
FIG. 1 is a schematic diagram of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The present invention includes an embodiment of a one-time programmable (OTP) memory cell. Herein, it may be that the OTP memory cell can be electronically programmed with data only once; and even though power is no longer supplied, programmed data in the OTP memory cell is retained.

FIG. 1 is a schematic circuit of a memory device in accordance with some embodiments. As depicted in FIG. 1, a memory device includes a plurality of OTP memory cells C1, C2, C3, C4, C5, and C6, a plurality of the word lines WLP0, WLR0, WLR1, WLP1, a plurality of the bit lines BL1, BL2, BL3, and a plurality of Schottky diodes D. The word lines WLP0, WLR0, WLR1, and WLP1 are arranged in X-direction, and each of the word lines WLP0, WLR0, WLR1, and WLP1 extends along Y-direction. The bit lines BL1, BL2, BL3 are arranged in Y-direction, and each of the bit lines BL1, BL2, BL3 extends along X-direction.

In some embodiments, each of the OTP memory cells C1-C6 includes a first transistor T0 and a second transistor T1. With respect to the OTP memory cell C1, a gate terminal of the first transistor T0 is electrically coupled to the word line WLP0 via a Schottky diodes D. A source/drain terminal of the first transistor T0 is floated, and the other source/drain terminal of the first transistor T0 is electrically coupled to a resistance node A. Herein, since the one source/drain terminal of the first transistor T0 does not have any effect on storing and reading data in the OTP memory cell C1, the one source/drain terminal of the first MOS transistor is floated. One source/drain terminal of the second transistor T1 is also coupled to the resistance node A, and the other source/drain terminal of the second transistor T1 is coupled to a bit line BL1. In some embodiments, the source/drain terminal of the first transistor T0 is electrically coupled to the source/drain terminal of the second transistor T1.

With respect to the OTP memory cell C2, a gate terminal of the first transistor T0 is electrically coupled to the word line WLP1 via a Schottky diodes D. A source/drain terminal of the first transistor T0 is floated, and the other source/drain terminal of the first transistor T0 is electrically coupled to a resistance node A. Herein, since the one source/drain terminal of the first transistor T0 does not have any effect on storing and reading data in the OTP memory cell C1, the one source/drain terminal of the first MOS transistor is floated. One source/drain terminal of the second transistor T1 is also coupled to the resistance node A, and the other source/drain terminal of the second transistor T1 is coupled to a bit line BL1. In some embodiments, the source/drain terminal of the first transistor T0 is electrically coupled to the source/drain terminal of the second transistor T1. In some embodiments, the OTP memory cells C1 and C2 share the same bit line BL1.

The OTP memory cell C3-C6 are similar to the OTP memory cells C1 and C2 as described above, and thus relevant details will not be repeated for brevity.

Generally, a gate of a transistor is formed by laminating conductive layers on an insulating layer. In a programming operation, an insulating layer of the gate of the first transistor T0 may be destroyed. The second transistor T1 serves as a switching element in order to select the OTP memory cell.

With respect to the OTP memory cells C1 and C2 again, a Schottky diode D is electrically coupled between the first transistor T0 of OTP memory cell C1 and the word line WLP0. On the other hand, a Schottky diodes D is electrically coupled between the first transistor T0 of OTP memory cell C2 and the word line WLP1. For example, with respect to the Schottky diode D connected between the first transistor T0 of OTP memory cell C1 and the word line WLP0, a first side of the Schottky diode D is connected to the first transistor T0, and a second side of the Schottky diode D is connected to the word line WLP0, in which a current flowing from the second side of the Schottky diode D to the first side of the Schottky diode D is referred to as "forward current", while a current flowing from the first side of the Schottky diode D to the second side of the Schottky diode D is referred to as "reverse current." In some embodiments, the Schottky diodes D only electrically coupled to the word lines WLP0 and WLP1. That is, the word lines WLR0 and WLR1 are free of connection with the Schottky diodes D. Stated another way, the current paths between the word lines WLR0 and WLR1 and the transistors T1 of OTP memory cells C1 and C2 are free of Schottky diodes D.

Figure 2A:
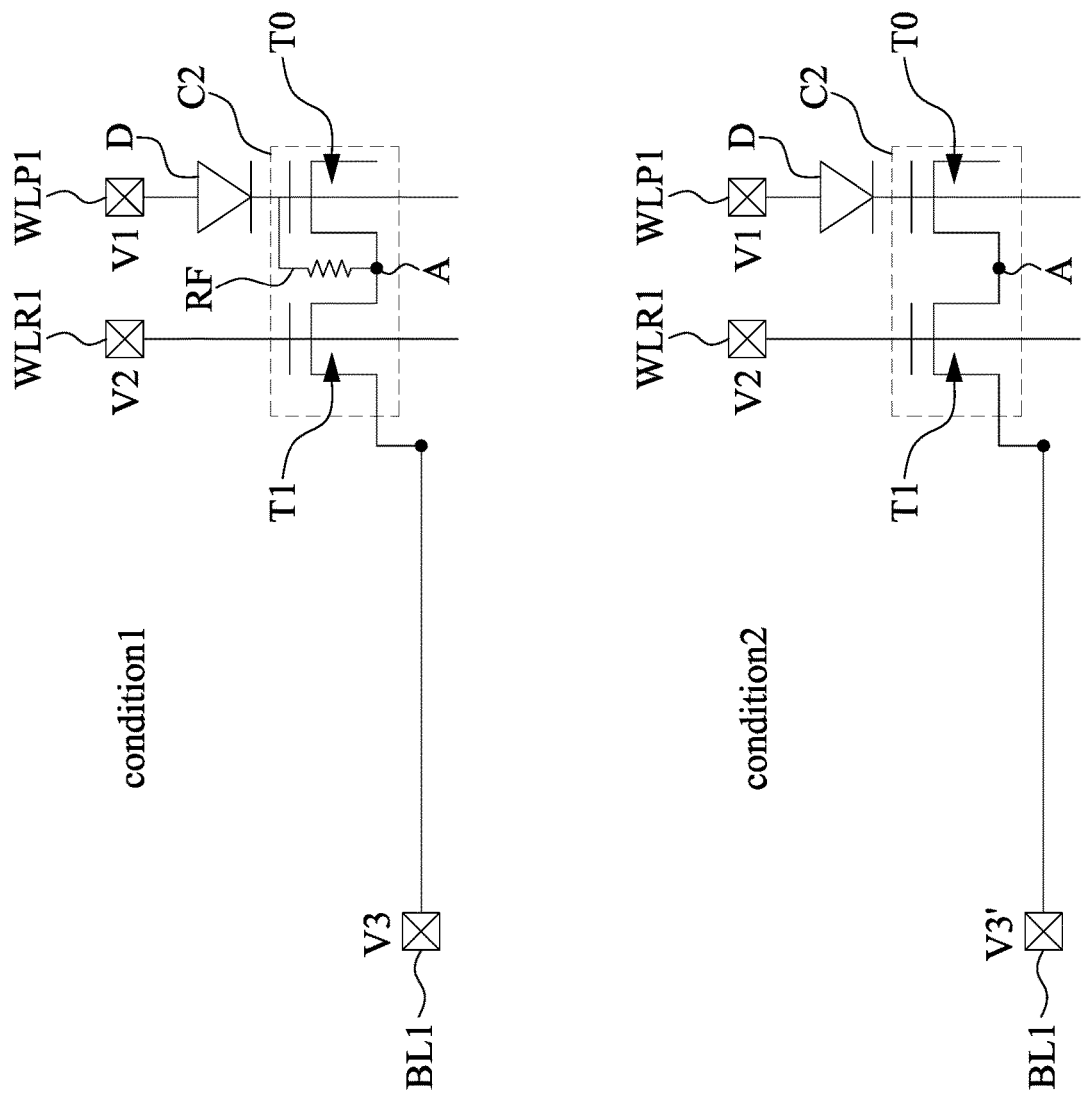
FIG. 2A is a schematic diagram for performing a programming operation to a memory device in accordance with some embodiments.

FIG. 2A is a schematic diagram for performing a programming operation to a memory device in accordance with some embodiments. FIG. 2A is a schematic diagram for performing a read operation to a memory device in accordance with some embodiments. It is noted that in FIGS. 2A and 2B, for simplicity, only the OTP memory cell C2 is illustrated. During the programming operation, the bodies of the first and the second MOS transistors M0 and M1 of the OTP memory cell C2 are coupled to a ground voltage.

Reference is made to FIG. 2A, in which FIG. 2A illustrates two different conditions during a programming operation. In condition 1 of FIG. 2A, the word line WLP1 is supplied with a high level voltage V1, and the world line WLR1 is coupled to a voltage V2 having a lower level than the high level voltage V1. The bit line BL1 is coupled to ground voltage V3. Herein, the voltage V2 is a voltage having a sufficient level to turn on the second transistor T1, and the high level voltage V1 is a voltage having a sufficient level to destroy an insulating layer (e.g., the gate dielectric layer 112 described in FIGS. 4A-4F) included in a gate structure (e.g., the gate structures G3 and/or G6 described in FIGS. 4A-4F) of the first transistor T0. In some embodiments, the voltage V2 may be about 1.2V-10V, which is sufficiently high to turn on the second transistor T1, and the high level voltage V1 may be higher than about 1.2V, such as about 5.3V. On the other hand, the ground voltage V3 can be regarded as having a voltage level of about 0V.

Since the gate of second transistor T1 is supplied with a voltage V2 that is sufficiently high to turn on the second transistor T1, the gate of the second transistor T1 is turned on, and thus the resistance node A is coupled to ground voltage V3. The gate of the first transistor T0 is coupled to the high level voltage V1. Due to a difference of voltage level supplied to the gate (e.g., voltage V1) and voltage level supplied to the one terminal of the first transistor T0 (e.g., voltage V3), the insulating layer of the first transistor T0 is destroyed, i.e., broken down. When the insulating layer is destroyed, a current path is created between the word line WLP1 and the resistance node A. The resulting circuit can be regarded as having a resistance RF in the current path. Accordingly, in condition 1, the OTP memory cell C2 can be referred to as "programmed" after the programming operation, because the insulating layer of the first transistor T0 is broken down.

In this configuration with the first transistor T0 coupled to the ground voltage V3, the insulating layer may not be reliably and/or consistently destroyed. In order to reliably destroy an insulating layer included in the gate structure of first transistor T0 during a programming operation, the insulating layer can be formed thinner than those of other transistors, such as the second transistor T1. Also, to increase programming reliability, the high level voltage V1 can have a higher voltage level than a predetermined voltage level, where the predetermined voltage level can destroy the insulating layer included in the gate structure of first transistor T0.

On the other hand, in condition 2 of FIG. 2A, the word line WLP1 is supplied with the high level voltage V1, and the world line WLR1 is coupled to the voltage V2 having a lower level than the high level voltage V1. The bit line BL1 is coupled to a voltage V3'. Here, the voltage V3' has a higher voltage level than the ground voltage V3 as described in condition 1 of FIG. 2A. For example, the voltage V3' may be about 1.2V, which is higher than the ground voltage V3 of about 0V. In some embodiments, the voltage V3' has substantially the same value as the voltage V2, such that the voltage difference between the gate terminal of the second transistor T1 and the source region terminal of the second transistor T1 may be about zero so that the second transistor T1 is turned off, and the source/drain terminal of the second transistor T1 connected to the first transistor T0 is floated. Even though the high level voltage V1 is applied to the first transistor T0 through the word line WLP1, an electric field will not be applied to the insulating layer of the second transistor T1 because the source/drain terminal of the first transistor T0 connected to the second transistor T1 is floated. In this way, the insulating layer of the first transistor T0 may not be broken down during the programming operation, the first transistor T0 remains its original function after the programming operation. Accordingly, in condition 2, the OTP memory cell C2 can be referred to as "un-programmed" after the programming operation, because the insulating layer of the first transistor T0 is not broken down.

Figure 2B:
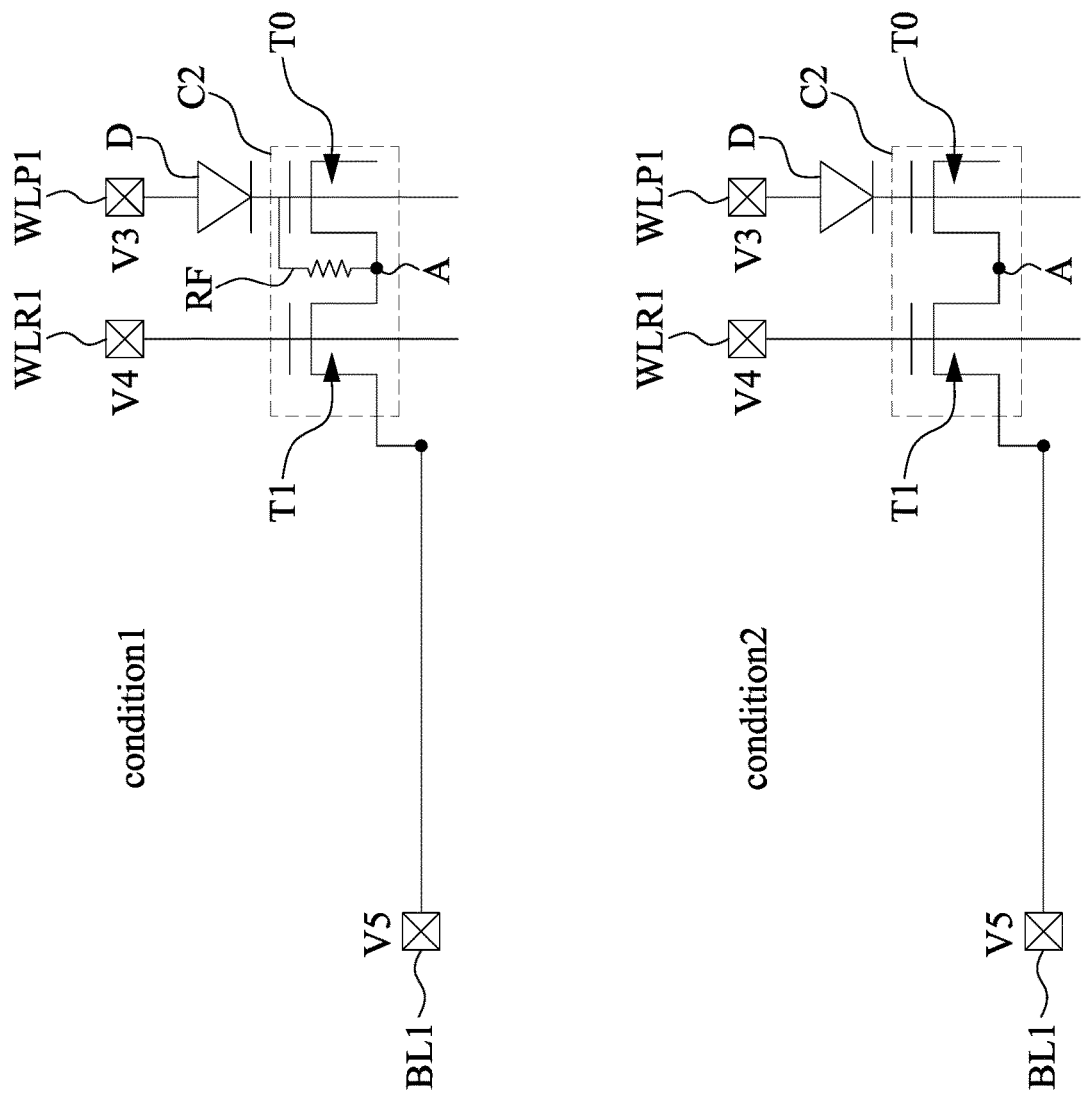
FIG. 2B is a schematic diagram for performing a read operation to a memory device in accordance with some embodiments.

Reference is made to FIG. 2B, in which FIG. 2B illustrates two different conditions during a programming operation. It is noted that the condition 1 of FIG. 2B follows the condition 1 of FIG. 2A, and the condition 2 of FIG. 2B follows the condition 2 of FIG. 2A.

In a read operation, the word line WLP1 is supplied with a power voltage V3, and the word line WLR1 is coupled to the power voltage V4. The bit line BL1 is precharged with a ground voltage level V5. The power voltage V4 is sufficiently high to turn on the second transistor T1.

In condition 1 of FIG. 2A where the insulating layer included in the gate structure of first transistor T0 is destroyed (breakdown state), the voltage of the bit line BL1 may increase, and a current path between the gate of the first transistor T0 and the bit line BL1 may increase as well. On the other hand, in condition 2 where the insulating layer included in the gate structure of first transistor T0 is not destroyed, the voltage level of bit line BL1 does not rise and therefore retains the precharged voltage level (i.e., ground voltage level V5), and thus there is no current path between the gate of the first transistor T0 and the bit line BL1. Data can be read depending on whether there is current on the bit line BL1. For instance, in condition 1, if the voltage or the current of the bit line BL increases because of the breakdown of the insulating layer of the first transistor T0, data '1' can be determined. On the other hand, if the voltage or the current of the bit line BL does not rise, data '0' can be determined. That is, if the insulating layer breaks down, the bit line BL1 may have a logic level of '1'; if the insulating layer does not break down, the bit line BL1 may have a logic level of '0'.

It is noted that because a Schottky diode D is coupled between the word line WLP1 and the first transistor T0, the Schottky diode D allows current flowing from the word line WLP1 to the first transistor T0. Accordingly, in condition 1 where the insulating layer included in the gate structure of first transistor T0 is destroyed, the current may be allowed by the Schottky diode D to flow from the word line WLP1 to the bit line BL1.

Figure 3:
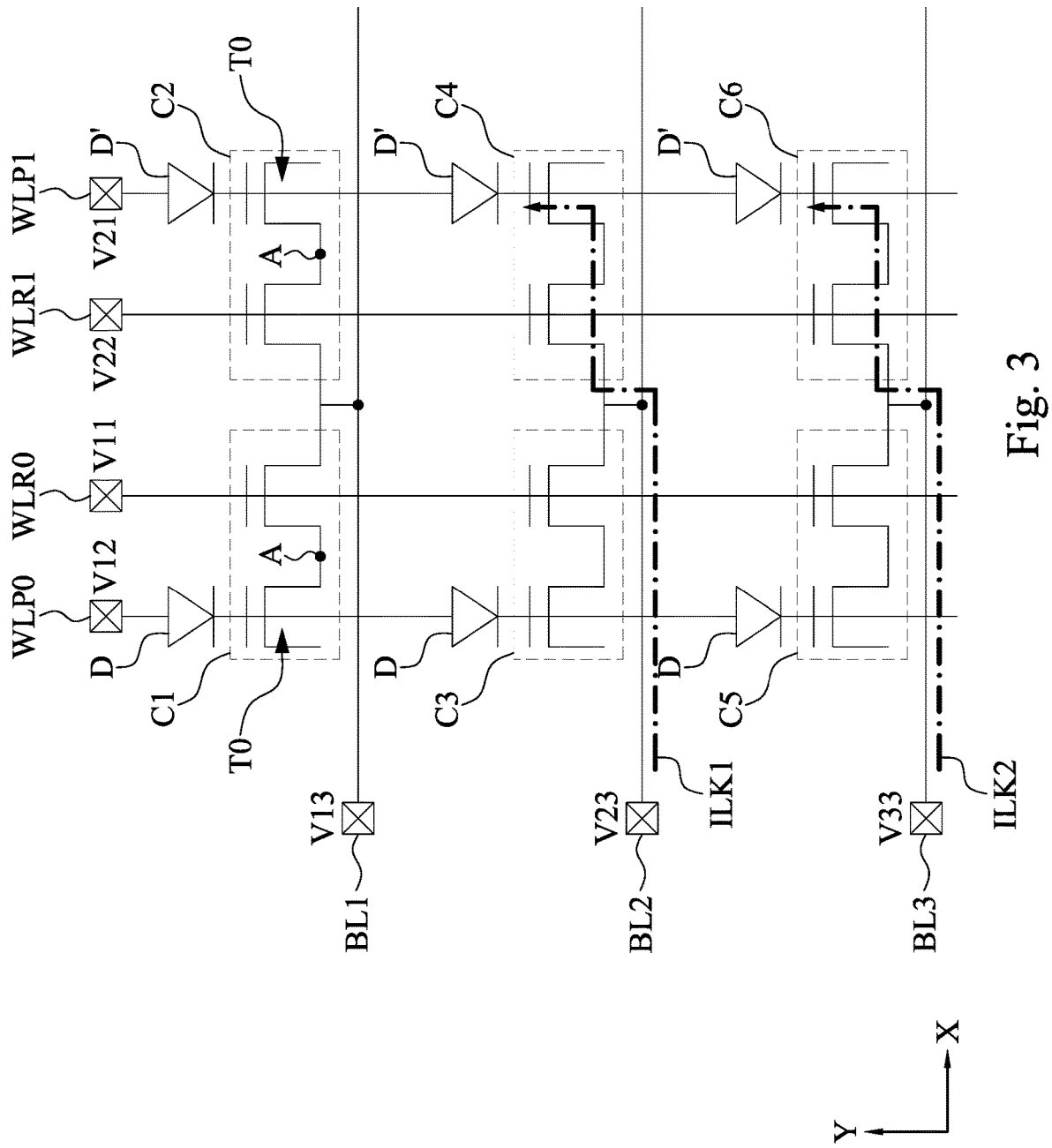
FIG. 3 is a schematic diagram for performing a read operation to a memory device in accordance with some embodiments.

FIG. 3 is a schematic diagram for performing a read operation to a memory device in accordance with some embodiments. It is noted that some elements of FIG. 3 are the same as those described in FIG. 1, and thus such elements are labeled the same and relevant details are not repeated for brevity.

In FIG. 3, the OTP memory cells C1-C6 have undergone a programming operation as described in FIG. 2A. In some embodiments, parts of the insulating layers of the first transistors T0 of OTP memory cells C1-C6 may be destroyed, while other parts of the insulating layers of the first transistors T0 of OTP memory cells C1-C6 may not be destroyed.

Then, a read operation is performed to read the data stored in the OTP memory cells C1-C6. In some embodiments as shown in FIG. 3, the read operation is performed to read the data stored in the OTP memory cell C1, while the read operation does not read the data stored in the OTP memory cells C2-C6. For example, the OTP memory cell C1 can be referred to as a "selected" cell, and the OTP memory cells C2-C6 can be referred to as "non-selected" cells. In this regard, the word line WLP0 is supplied with a power voltage V12, and the word line WLR0 is coupled to the power voltage V11. The bit line BL1 is precharged with a ground voltage level V13. In some embodiments, the power voltage V12 may be about 1.1V-7V (e.g., about 1.3V), the power voltage V11 may be about 0.5V-1V (e.g., about 0.75V), and the ground voltage level V13 may be about 0V. As mentioned above with respect to FIG. 2B, power voltage V11 is sufficiently high to turn on the second transistor T1 of the OTP memory cell C1, and the stored data (e.g., 1 or 0) in the OTP memory cells C1 can be read depending on whether there is current on the bit line BL1. In some embodiments, the word lines WLR0 and WLR1 can be referred to as "selected" word lines, and the bit line BL1 can be referred to as "selected" bit line.

On the other hand, the word line WLP1 is supplied with a ground voltage V21, and the word line WLR1 is coupled to the ground voltage V22. The bit line BL2 is precharged with a voltage V23, and the bit line BL3 is precharged with a voltage V33.

With respect to OTP memory cells C3 and C5, in some embodiments, the voltages V23 and V33 applied respectively to the bit line BL2 and BL3 may have substantially the same value as the voltage V11 applied to the word line WLR0, such that the voltage difference between the gate terminals of the second transistors T1 of the OTP memory cells C3 and C5 and the source region terminals of the second transistors T1 of the OTP memory cells C3 and C5 may be zero so that the second transistors T1 of the OTP memory cells C3 and C5 are turned off. In this regard, and thus there is no current path between the second transistors T1 of the OTP memory cells C3 and C5 and the bit lines BL2 and BL3, respectively. In some embodiments, if the voltage V11 is about 0.75 V, and the voltages V23 and V33 may be about 0.75V.

With respect to OTP memory cells C2, C4, and C6, as mentioned above, the word line WLP1 is supplied with a ground voltage level V21, and the word line WLR1 is coupled to the ground voltage level V22. The transistors T0 and/or T1 in the OTP memory cells C2, C4, and C6 are turned off, and thus no current will flow from the OTP memory cells C2, C4, and C6 to the bit lines BL1, BL2, and BL3.

However, as mentioned above, the bit lines BL2 and BL3 may have substantially the same value as the voltage V11 applied to the word line WLR0. Such voltage V11 may be higher than the voltages of the ground voltage level V21 of the word line WLP1 (i.e., about 0 V), and such voltage difference creates a reverse bias to the first transistors T0 in the OTP memory cells C4 and C6. As an example of OTP memory cell C4, a leakage current ILK1 (drawn in dash-line arrow) may be generated and may flow from the bit line BL2 toward the word line WLP1. However, because the a Schottky diode D is coupled between the word line WLP1 and the first transistor T0 of the OTP memory cell C4, the Schottky diode D can block the reverse leakage current ILK1, so as to prevent a current leakage from a bit line to a word line. Similarly, a leakage current ILK2 flows from the bit line BL3 can also be blocked by a Schottky diode D coupled between the word line WLP1 and the first transistor T0 of the OTP memory cell C6.

In some embodiments of the present disclosure, a plurality of Schottky diodes are coupled between word lines and transistors of OTP memory cells. In some embodiments where an OTP memory cell is "non-selected" during a read operation, a word line coupled to the OTP memory cell may be supplied with a ground voltage level. While a bit line coupled to the OTP memory cell may have a higher voltage level than the ground voltage level, which will result in a reverse bias to a transistor in the OTP memory cell. In some embodiments, a leakage current may be generated due to the reverse bias and may flow from the bit line toward the word line. However, because a Schottky diode is coupled between the word line and the transistor of the OTP memory cell, the reverse leakage current can be blocked by the Schottky diode, which in turn will improve the device performance.

Figure 4A:
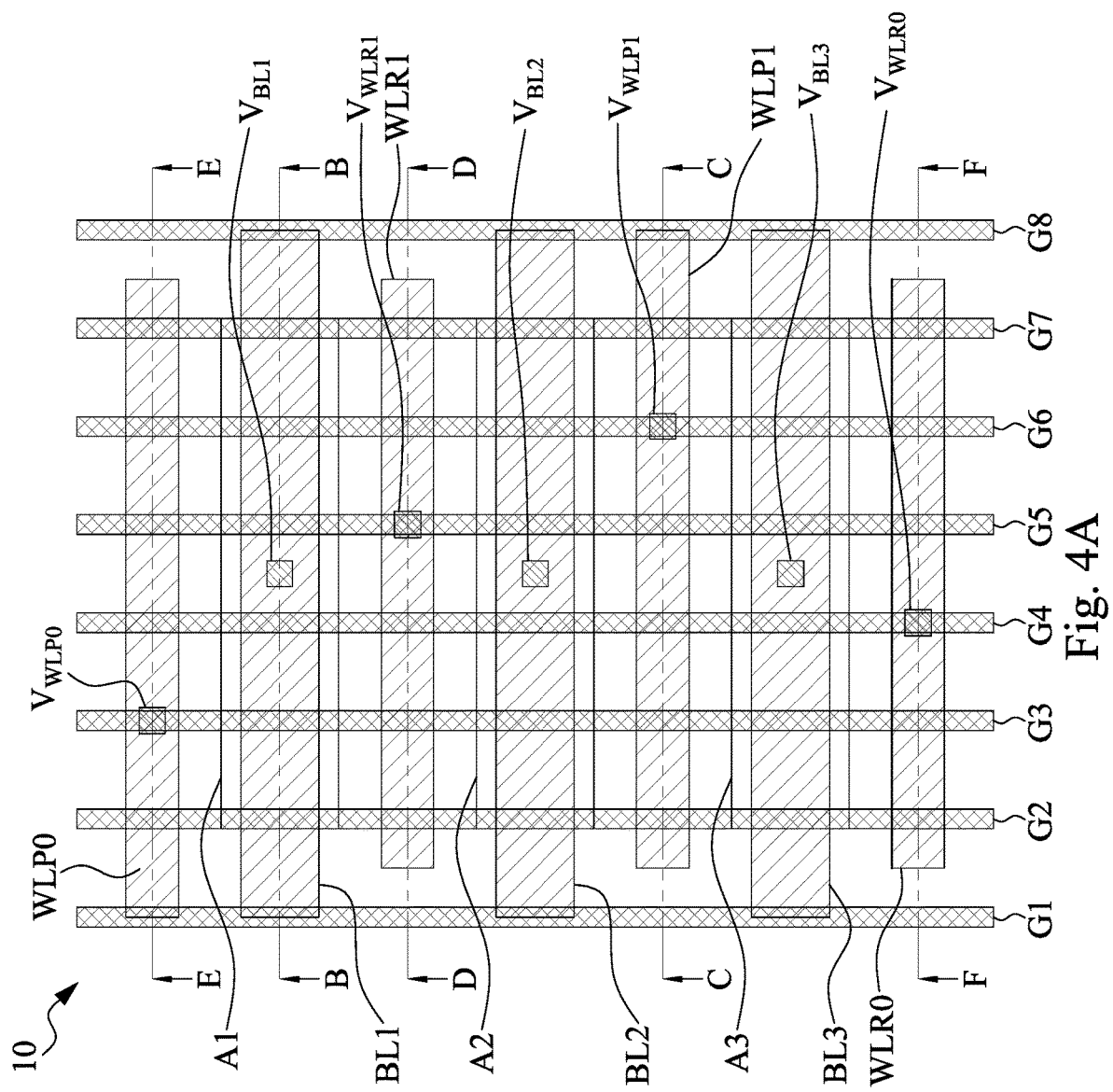
FIG. 4A is a top view of a memory device in accordance with some embodiments.

FIG. 4A is a top view of a memory device 10 in accordance with some embodiments. FIGS. 4B to 4F are cross-sectional views of the memory device of FIG. 4A in accordance with some embodiments, in which FIGS. 4B, 4C, 4E, and 4F are cross-sectional views taken along line B-B, line C-C, line D-D, line E-E, and line F-F of FIG. 4A. It is noted that some elements of FIGS. 4B to 4F are not illustrated in FIG. 4A for brevity. It is noted that the memory device 10 described FIGS. 4A-4F corresponds to the circuit as described in FIG. 1.

The memory device 10 includes a substrate 100. In some embodiments, the substrate 100 may be a semiconductor material and may include known structures including a graded layer or a buried oxide, for example. In some embodiments, the substrate 100 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 100. Alternatively, the silicon substrate 100 may be an active layer of a semiconductor-on-insulator (SOI) substrate or a multi-layered structure such as a silicon-germanium layer formed on a bulk silicon layer.

A plurality of active regions A1, A2, and A3 are disposed over the substrate 100 and are laterally surrounded by an isolation structure 106 formed of dielectric material. The isolation structure 106 may be a shallow trench isolation (STI) structure, a deep trench isolation (DTI) structure, another suitable isolation structure(s), a combination of the foregoing, or the like. In some embodiments where the STI region 106 is made of oxide (e.g., silicon oxide), the active regions A1, A2, A3 can be interchangeably referred to as oxide defined (OD) regions. In some embodiments, the active regions A1, A2, A3 are semiconductor fins protruding from the substrate 100.

A plurality of gate structures G1, G2, G3, G4, G5, G6, G7, and G8 are disposed over the substrate 100. In some embodiments, the gate structures G2 to G7 cross the active regions A1, A2, A3 along a direction perpendicular to a lengthwise direction of the active regions A1, A2, A3. That is, the active regions A1, A2, A3 share the same gate structures G2 to G7. In some embodiments, each of the gate structures G1-G8 includes a gate dielectric layer 112, a work function metal layer 114, and a filling metal 116.

In some embodiments, the gate dielectric layers 112 of gate structures G1-G8 may be made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layers 112 are oxide layers. The gate dielectric layers 112 may be formed by a deposition processes, such as chemical vapor deposition (CVD), physical vapor deposition (PVD), atomic layer deposition (ALD), plasma enhanced CVD (PECVD) or other suitable techniques. In some embodiments, the gate dielectric layers 112 of the gate structures G3 and G6 are thinner than the gate dielectric layers 112 of the gate structures G4 and G5, as the gate dielectric layers 112 of the gate structures G3 and G6 may act as the insulting layer of the first transistors T0 described in FIGS. 1 to 3.

In some embodiments, the work function metal layers 114 of the gate structures G1-G8 may be an n-type or p-type work function layers. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function metal layers 114 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof.

In some embodiments, the filling metals 116 of gate structures G1-G8 may include tungsten (W). In some other embodiments, the filling metals 116 include aluminum (Al), copper (Cu) or other suitable conductive material. The filling metals 116 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof.

A plurality of gate spacers 120 are disposed on opposite sidewalls of the gate structures G1-G8. In some embodiments, the gate spacers 120 may include $SiO_2$, $Si_3N_4$, $SiO_xN_y$, SiC, SiCN films, SiOC, SiOCN films, and/or combinations thereof.

A plurality of source/drain structures SD1, SD2, SD3, SD4, and SD5 are disposed in the active regions A1, A2, and A3 over the substrate 100. As an example of FIG. 4B, the source/drain structures SD1 and SD2 are disposed on opposite sides of the gate structure G3, the source/drain structures SD2 and SD3 are disposed on opposite sides of the gate structure G4, the source/drain structures SD3 and SD4 are disposed on opposite sides of the gate structure G5, and the source/drain structures SD4 and SD5 are disposed on opposite sides of the gate structure G6, respectively. In some embodiments, the source/drain structures SD1-SD5 may be may be formed by performing an epitaxial growth process that provides an epitaxy material over the substrate 100, and thus the source/drain structures SD1-SD5 can also be interchangeably referred to as epitaxy structures SD1-SD5 in this content. In various embodiments, the source/drain structures SD1-SD5 may include Ge, Si, GaAs, AlGaAs, SiGe, GaAsP, SiP, or other suitable material.

Figure 4B:
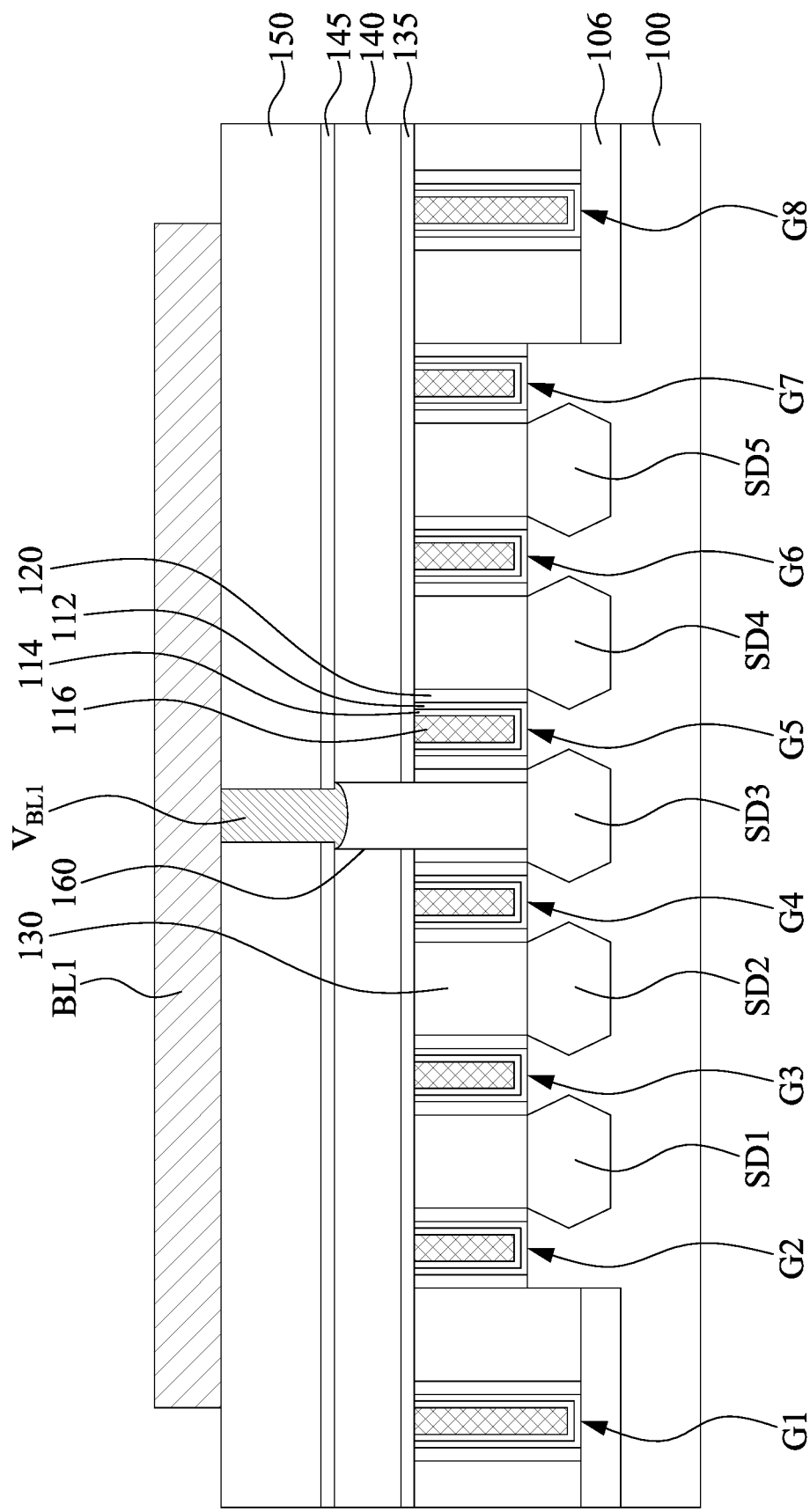
FIGS. 4B to 4G are cross-sectional views of the memory device of FIG. 4A in accordance with some embodiments.

Reference is made to FIGS. 1, 4A, and 4B. The gate structure G3, the source/drain structures SD1 and SD2, and the active region A1 form the first transistor T0 of the OTP memory cell C1, and the gate structure G4, the source/drain structures SD2 and SD3, and the active region A1 form the second transistor T1 of the OTP memory cell C1. Similarly, the gate structure G6, the source/drain structures SD4 and SD5, and the active region A1 form the first transistor T0 of the OTP memory cell C2, and the gate structure G5, the source/drain structures SD3 and SD4, and the active region A1 form the second transistor T1 of the OTP memory cell C2. The OTP memory cells C3-C6 of FIG. 1 have similar structures as those of the OTP memory cells C1 and C2 herein, and thus relevant details are omitted for brevity.

As mentioned above with respect to FIG. 1, in some embodiments, the insulating layer (e.g., the dielectric layer 112) of gate structure of first transistor T0 can be formed thinner than those of other transistors, such as the second transistor T1. Accordingly, in some embodiments, the dielectric layers 112 of the gate structures G3 and G6 may be thinner than the dielectric layers 112 of the gate structures G4 and G5.

An interlayer dielectric (ILD) layer 130 is disposed over the substrate 100, over the source/drain structures SD1-SD5, and surrounding the gate structures G1-G8. In some embodiments, the ILD layer 130 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 130 may be formed using, for example, CVD, ALD, spin-on-glass (SOG) or other suitable techniques.

An etch stop layer (ESL) 135, an ILD layer 140, a etch stop layer (ESL) 145, and an ILD layer 150 are disposed in sequence over the gate structures G1-G8 and the ILD layer 130. The materials and the formation method of the ILD layers 140 and 150 are similar to those of the ILD layer 130 described above. The ESLs 135 and 145 may include materials different from the ILD layers 130, 140, and 150. In some embodiments, the ESLs 135 and 145 include silicon nitride, silicon oxynitride or other suitable materials. The ESLs 135 and 145 can be formed using, for example, plasma enhanced CVD, low pressure CVD, ALD or other suitable techniques.

Referring to FIGS. 4A and 4B, a source/drain contact 160 extends through the ILD layer 140, the ESL 135, and the ILD layer 130 and contacts the source/drain structure SD3. In some embodiments, the source/drain contact 160 may include a liner and a filling metal. The liner is between filling metal and the underlying source/drain structure SD3. In some embodiments, the liner assists with the deposition of filling metal and helps to reduce diffusion of a material of filling metal through the gate spacers 120. In some embodiments, the liner includes titanium (Ti), titanium nitride (TiN), tantalum (Ta), tantalum nitride (TaN), or another suitable material. The filling metal includes a conductive material, such tungsten (W), copper (Cu), aluminum (Al), ruthenium (Ru), cobalt (Co), molybdenum (Mo), nickel (Ni), or other suitable conductive material. In some embodiments, a silicide layer may be disposed between the source/drain contact 160 and the source/drain structure SD3.

A via $V_{BL1}$ extends through the ILD layer 150 and the ESL 145, and contacts the source/drain contact 160. The via $V_{BL2}$ has an upper portion and a lower portion, in which the lower portion is below the bottom surface of the ESL 145 and contacts the source/drain contact 160, while the upper portion is above the bottom surface of the ESL 145 and in the ILD layer 150 and the ESL 145. In some embodiments, the lower portion of the via $V_{BL1}$ is wider than the upper portion of the via $V_{BL1}$. In some embodiments, the lower portion of the via $V_{BL1}$ contacts the bottom surface of the ESL 145. In some embodiments, the upper portion of the via $V_{BL1}$ is narrower than the source/drain contact 160. In some embodiments, the via $V_{BL1}$ includes a conductive material, such tungsten (W). Other conductive materials may be used for the via $V_{BL1}$, such as copper (Cu), aluminum (Al), ruthenium (Ru), cobalt (Co), molybdenum (Mo), nickel (Ni), or the like. The via $V_{BL1}$ can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof.

A bit line BL1 overlies the ILD layer 150 and contacts the via $V_{BL2}$. In some embodiments, the bit line BL1 may include copper (Cu), aluminum (Al), ruthenium (Ru), cobalt (Co), molybdenum (Mo), nickel (Ni), tungsten (W), or the like. The bit line BL1 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof.

Figure 4C:
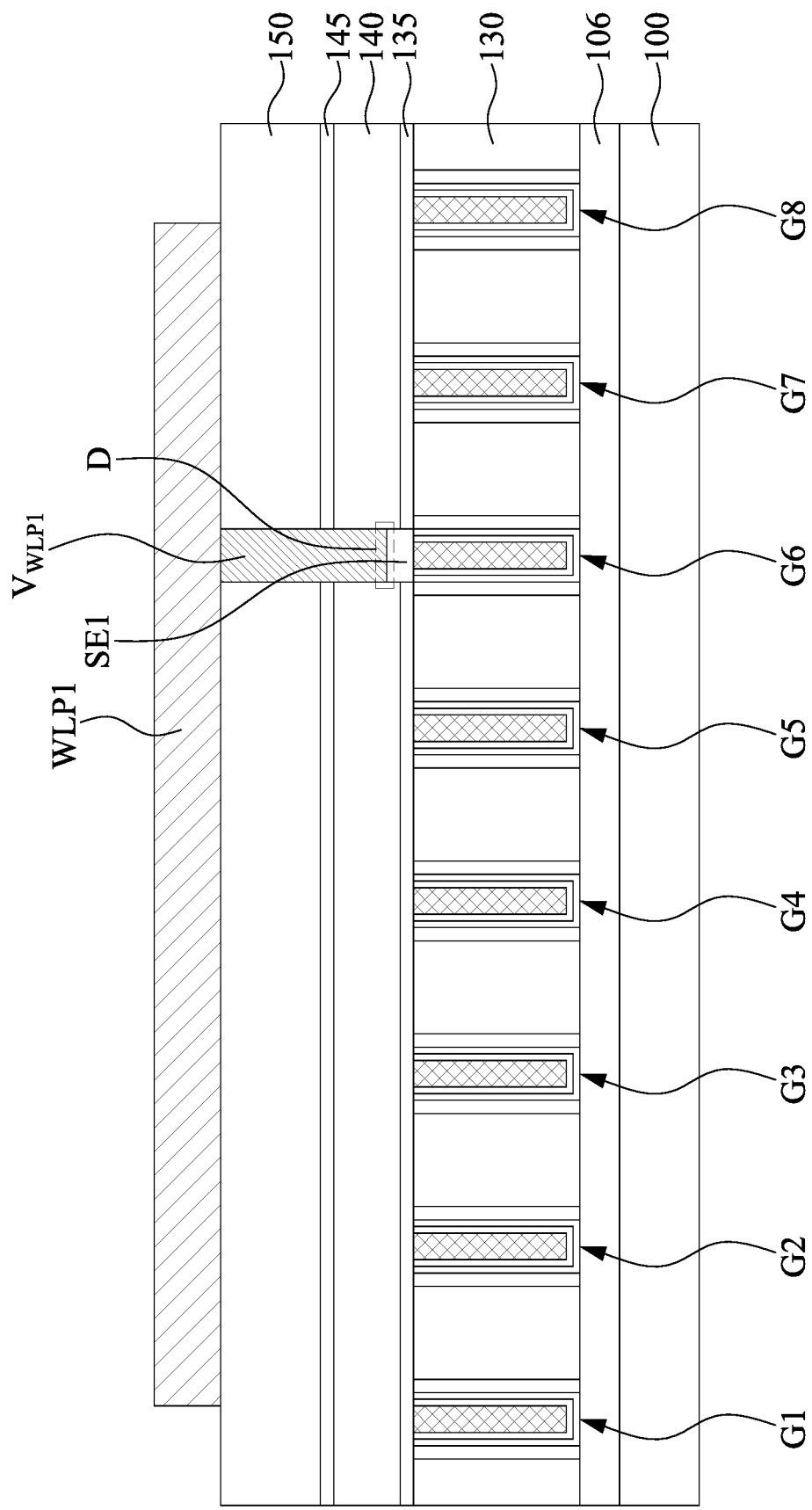

Reference is made to FIGS. 4A and 4C. A semiconductor layer SE1 is disposed in the ILD layer 140 and the ESL 135, and contacts the gate structure G6. The semiconductor layer SE1 may be silicon, or suitable semiconductor layer SE1. The semiconductor layer SE1 may be formed by suitable process, such as chemical vapor deposition (CVD), physical vapor deposition (PVD), atomic layer deposition (ALD), or any suitable process. In some embodiments, the semiconductor layer SE1 is un-doped.

A via $V_{WLP1}$ extends through the ILD layer 150, the ESL 145, and the ILD layer 140, and contacts the semiconductor layer SE1. The material and the formation method of via $V_{WLP1}$ are similar to those of the via $V_{BL2}$. A word line WLP1 overlies the ILD layer 150 and contacts the $V_{WLP1}$. The material and the formation method of word line WLP1 are similar to those of the bit line BL1.

In some embodiments, the semiconductor layer SE1 and the via $V_{WLP1}$ have a metal-semiconductor contact interface. This metal-semiconductor contact region forms a Schottky diode D (or Schottky barrier diode). The Schottky diode D has a property that substantially restricts current flow to one direction. When forward biased (i.e., voltage on metal side is higher than voltage on semiconductor side), a Schottky diode is in an "on" state and current is allowed to flow through the diode. When the diode is reverse biased (i.e., voltage on semiconductor is higher than voltage on metal side), a Schottky diode is in an "off" state and ideally will not allow current to flow. As described above with respect to FIG. 3, the Schottky diode D formed by the semiconductor layer SE1 and the via $V_{WLP0}$ can prevent leakage current from the bit lines (i.e., bit lines BL2 and BL3).

In some embodiments, the thickness of the semiconductor layer SE1 is in a range from about 0.5 nm to about 4 nm. If the thickness of the semiconductor layer SE1 is too low (i.e., much lower than 0.5 nm), the resistance of the semiconductor layer SE1 may be too low and thus the leakage current from bit line may directly flow through the semiconductor layer SE1 to the via $V_{WLP1}$ and thus the Schottky diode D formed by the semiconductor layer SE1 and the via $V_{WLP1}$ is unable to restrict the leakage current. If the thickness of the semiconductor layer SE1 is too large (i.e., much greater than 4 nm), the resistance of the semiconductor layer SE1 may be too high, which will deteriorate the device performance.

Figure 4D:
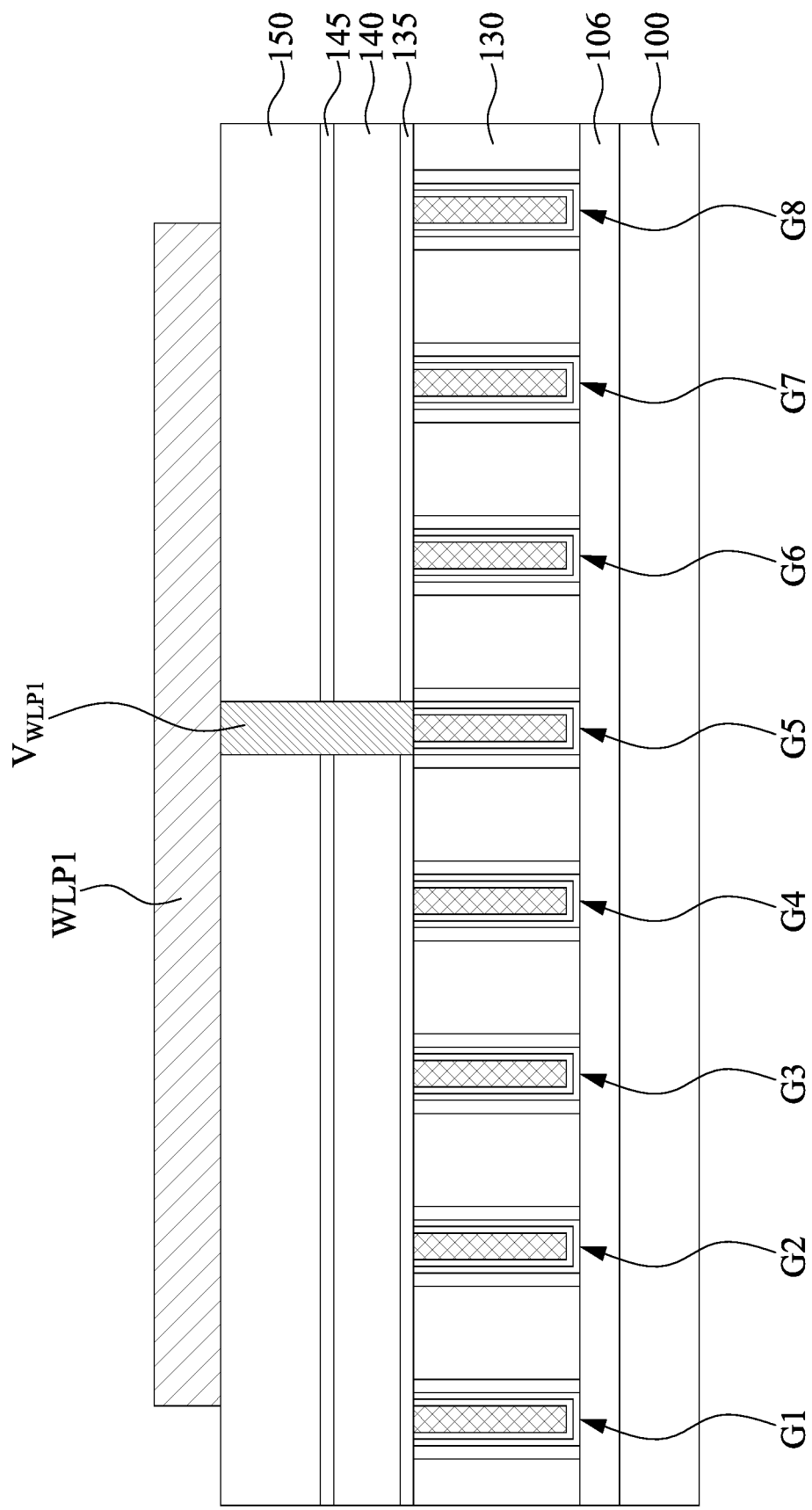

Reference is made to FIGS. 4A and 4D. A via $V_{WLR1}$ extends through the ILD layer 150, ESL 145, ILD layer 140, and the ESL 135, and contacts the gate structure G5. The material and the formation method of via $V_{WLR1}$ are similar to those of the via $V_{BL2}$. A word line WLR1 overlies the ILD layer 150 and contacts the via $V_{WLR1}$. The material and the formation method of word line WLR0 are similar to those of the bit line BL1.

Figure 4E:
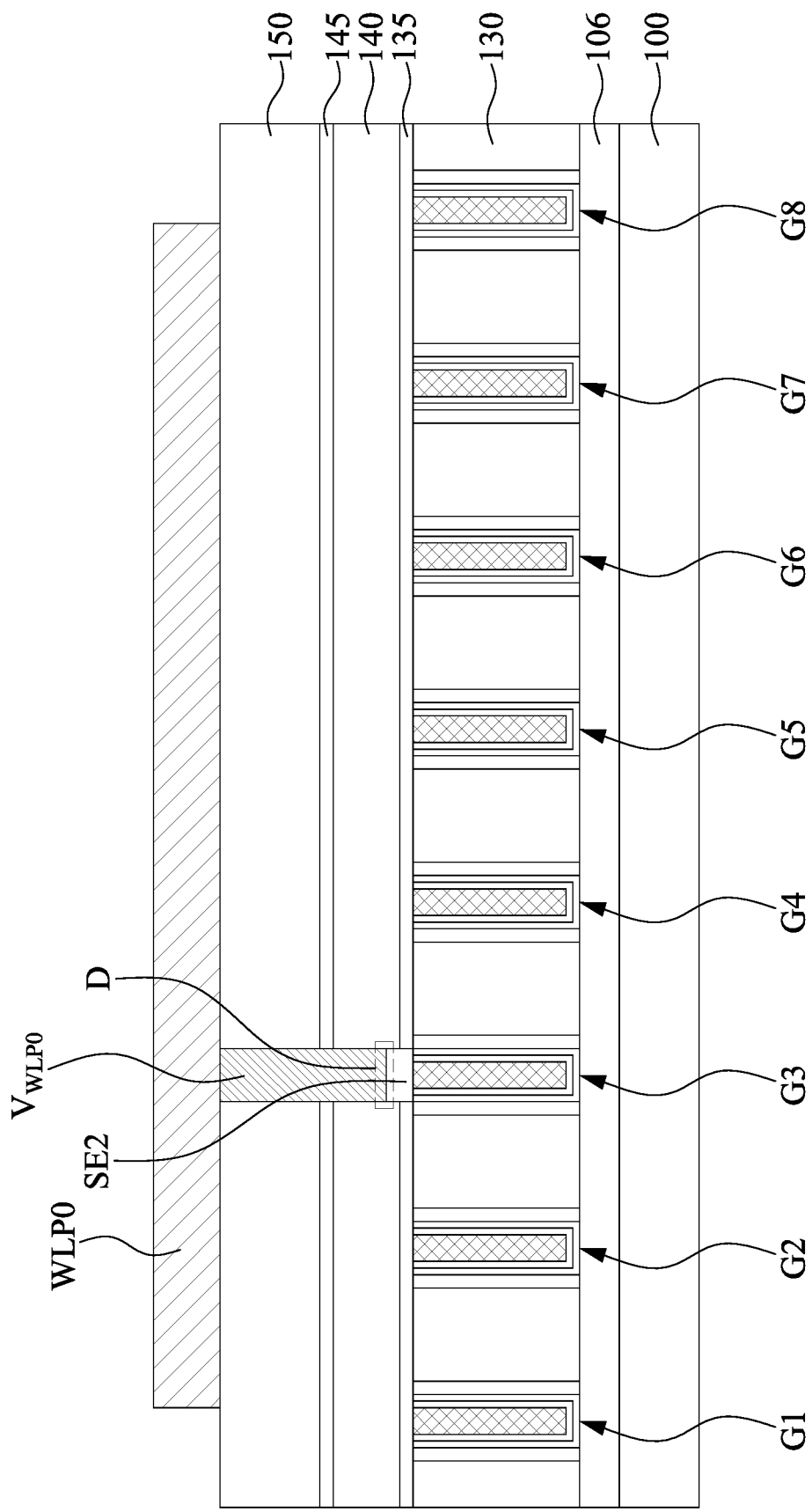

Reference is made to FIGS. 4A and 4E. FIG. 4E is similar to FIG. 4C, in which a semiconductor layer SE2 is disposed in the ILD layer 140 and the ESL 135, and contacts the gate structure G3, via $V_{WLP0}$ extends through the ILD layer 150, the ESL 145, and the ILD layer 140, and contacts the semiconductor layer SE2, and a word line WLP0 overlies the ILD layer 150 and contacts the $V_{WLP0}$. The semiconductor layer SE2 and the $V_{WLP0}$ form a Schottky diode D.

Figure 4F:
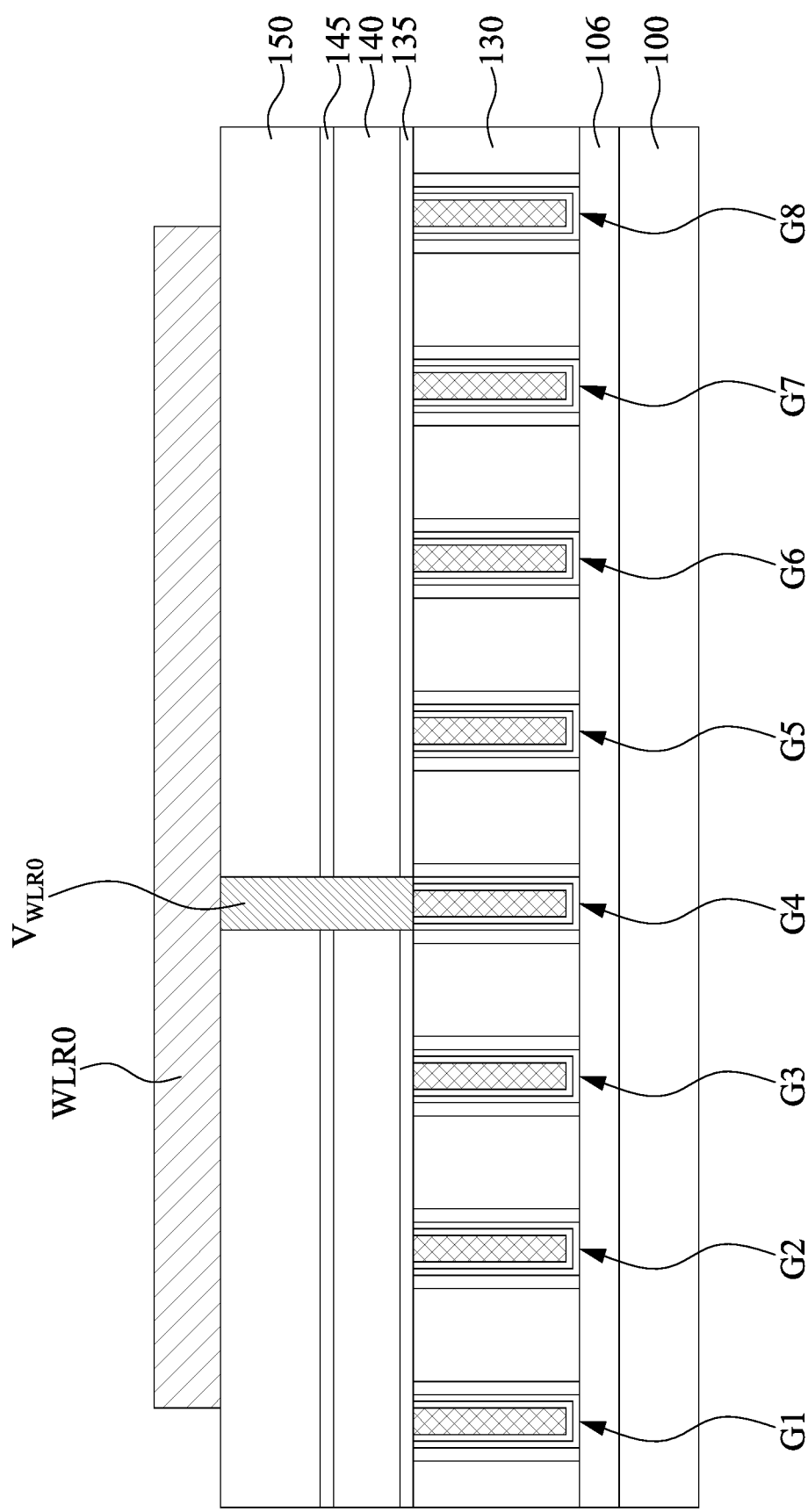

Reference is made to FIGS. 4A and 4F. FIG. 4F is similar to FIG. 4D, a via $V_{WLR0}$ extends through the ILD layer 150, ESL 145, ILD layer 140, and the ESL 135, and contacts the gate structure G4, and a word line WLR0 overlies the ILD layer 150 and contacts the via $V_{WLR0}$.

Figure 4G:
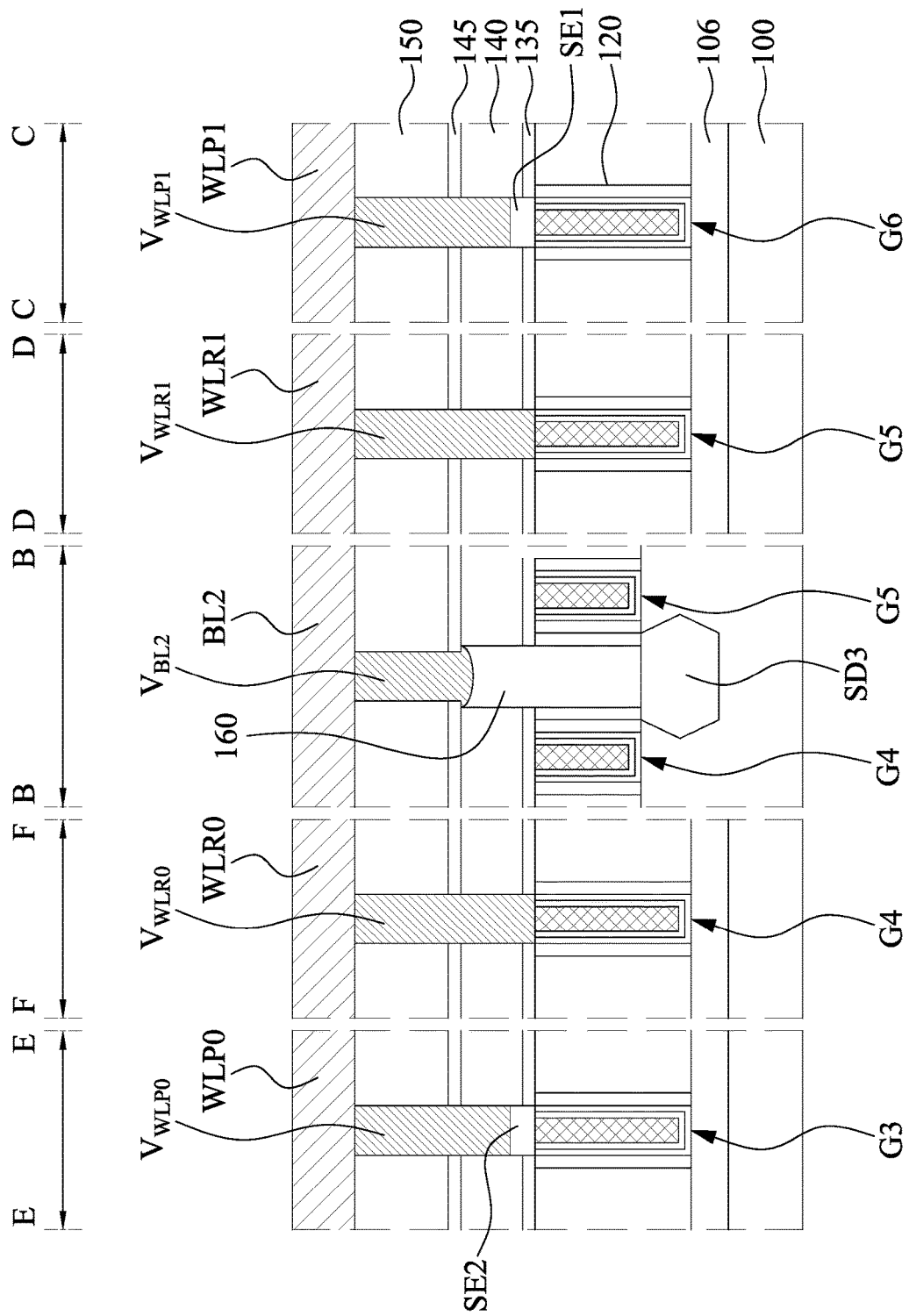

Reference is made to FIG. 4G, in which parts of the cross-section views of FIGS. 4B to 4F are illustrated in FIG. 4G so as to clearly discuss the structural relationship between elements in FIGS. 4B to 4F.

As mentioned above, the semiconductor layer SE1 is disposed on the gate structure G6, so as to form a Schottky diode with the via $V_{WLP1}$ above. Similarly, the semiconductor layer SE2 is disposed on the gate structure G3, so as to form a Schottky diode with the via $V_{WLP0}$ above. Accordingly, the gate structures G3 and G6 are electrically coupled to the word lines WLP0 and WLP1 at least in part by a non-metal layer, such as the semiconductor layers SE2, SE1. As a result, the vias $V_{WLP0}$ and $V_{WLR0}$ are separated respectively from the gate structures G3 and G6. In some embodiments, the interface of the via $V_{WLP0}$ and the semiconductor layer SE1 is higher than the top surface of the ESL 135.

On the other hand, the vias $V_{WLR0}$ and $V_{WLR1}$ are in direct contact with the gate structures G4 and G5, respectively. That is, no semiconductor layers are between the vias $V_{WLR0}/V_{WLR1}$ and the gate structures G4/G5. Accordingly, bottom surfaces of the vias $V_{WLR0}$ and $V_{WLR1}$ are lower than the bottom surfaces of the vias $V_{WLP0}$ and $V_{WLP1}$, while top surfaces of the vias $V_{WLR0}$ and $V_{WLR1}$ are substantially level with top surfaces of the vias $V_{WLP0}$ and $V_{WLP1}$. That is, along a direction perpendicular to the top surface of the substrate 100, the vias $V_{WLR0}$ and $V_{WLR1}$ are thicker than the vias $V_{WLP0}$ and $V_{WLP1}$.

The via $V_{BL2}$ is in direct contact with the source/drain contact 160. As the source/drain contact 160 is formed extending through the ILD layer 140, the bottom surface of the via $V_{BL2}$ is at a higher level than bottom surfaces of the vias $V_{WLR0}$, $V_{WLR1}$, $V_{WLP0}$, and $V_{WLP1}$. Accordingly, along a direction perpendicular to the top surface of the substrate 100, the via $V_{BL2}$ is thinner than the vias $V_{WLR0}$, $V_{WLR1}$, $V_{WLP0}$, and $V_{WLP1}$.

FIGS. 5A to 17D illustrate a method in various stages of fabricating the memory device 10 as described in FIGS. 4A to 4F in accordance with some embodiments of the present disclosure.

Figure 5B:
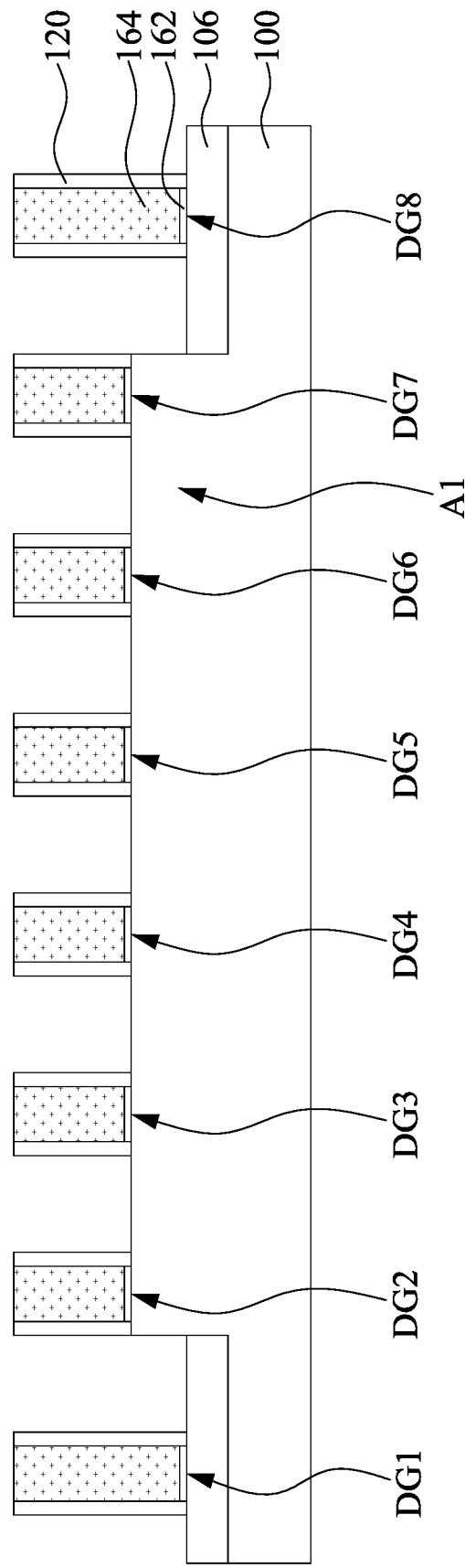
FIGS. 5A to 17D illustrate a method in various stages of fabricating the memory device in accordance with some embodiments of the present disclosure.
Figure 5C:
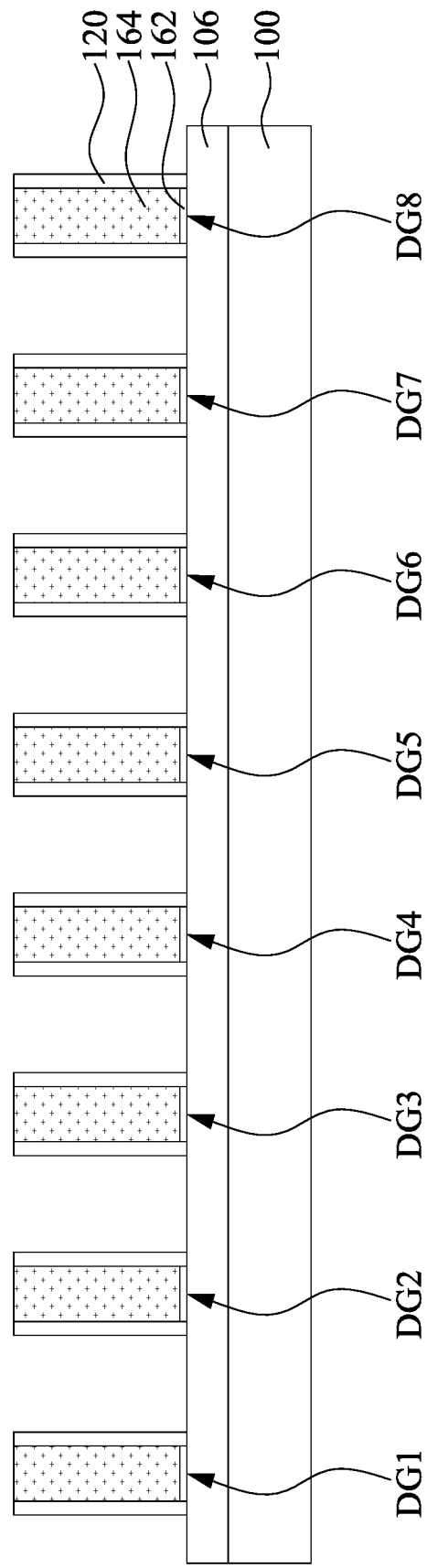

Reference is made to FIGS. 5A to 5C, in which FIG. 5B is a cross-sectional view along line B-B of FIG. 5A, and FIG. 5C is a cross-sectional view along line C-C of FIG. 5A. Shown there is an initial structure, the initial structure includes a substrate 100, a plurality of active regions A1, A2, and A3 over the substrate 100, and an isolation structure 106 laterally surrounding the active regions A1, A2, and A3. For example, the active regions A1, A2, and A3 may be formed by patterning the substrate 100 by photolithography process. Then, an isolation layer may be formed over the substrate 100, followed by an etching back process to form the isolation structure 106. In the depicted embodiments, the active regions A1-A3 are fin structures protruding above the isolation structure 106 due to the etching back process that pull backs the isolation structure 106. In this way, the transistors formed on the active regions A1-A3 are fin-type field effect transistors (FinFETs). However, in some other embodiments, the etching back process that pulls back the isolation structure 106 can be omitted, and thus the isolation structure 106 has a top surface substantially level with that of the active regions A1-A3. In this way, the transistors formed on the active regions A1-A3 are planar transistors.

A plurality of dummy gate structures DG1, DG2, DG3, DG4, DG5, DG6, DG7, and DG8 are formed over the substrate 100. In some embodiments, the dummy gate structures DG2-DG7 cross the active regions A1-A3, while the dummy gate structures D1 and D8 do not cross the active regions A1-A3.

Each of the dummy gate structures DG1-DG8 includes a gate dielectric layer 162 and a dummy gate 164. In some embodiments, the dummy gate structures DG1-DG8 may be formed by, for example, depositing a gate dielectric material and a dummy gate material over the substrate 100, followed by a patterning process to pattern the gate dielectric material and the dummy gate material to form the dummy gate structures DG1-DG8.

The gate dielectric layer 162 may be, for example, silicon oxide, silicon nitride, a combination thereof, or the like, and may be deposited or thermally grown according to acceptable techniques. The gate dielectric layer 162 may be formed by suitable process, such as chemical vapor deposition (CVD), physical vapor deposition (PVD), atomic layer deposition (ALD), or any suitable process.

The dummy gate layer 164 may include polycrystalline-silicon (poly-Si) or poly-crystalline silicon-germanium (poly-SiGe). Further, the dummy gate layer 164 may be doped poly-silicon with uniform or non-uniform doping. The dummy gate layer 164 may be formed by suitable process, such as chemical vapor deposition (CVD), physical vapor deposition (PVD), atomic layer deposition (ALD), or any suitable process.

A plurality of gate spacers 120 are formed on opposite sidewalls of the dummy gate structures DG1-DG8. The gate spacers 120 may be formed by, for example, depositing a spacer layer blanket over the dummy gate structures DG1-DG8, followed by an etching process to remove horizontal portions of the spacer layer, such that vertical portions of the spacer layer remain on sidewalls of the dummy gate structures DG1-DG8.

Figure 6A:
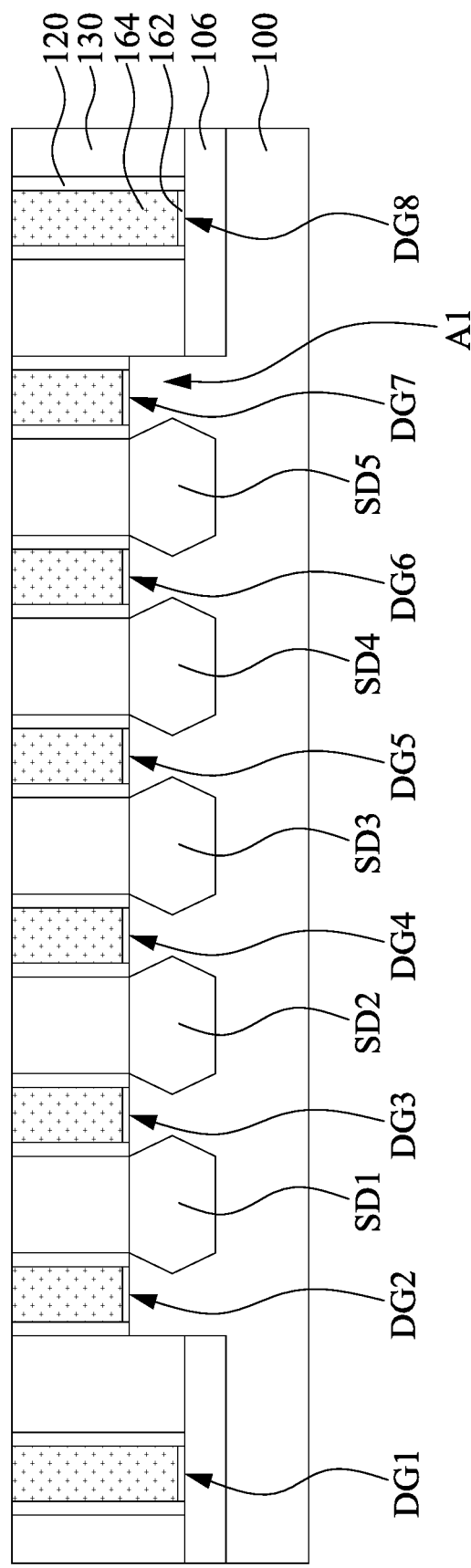
Figure 6B:
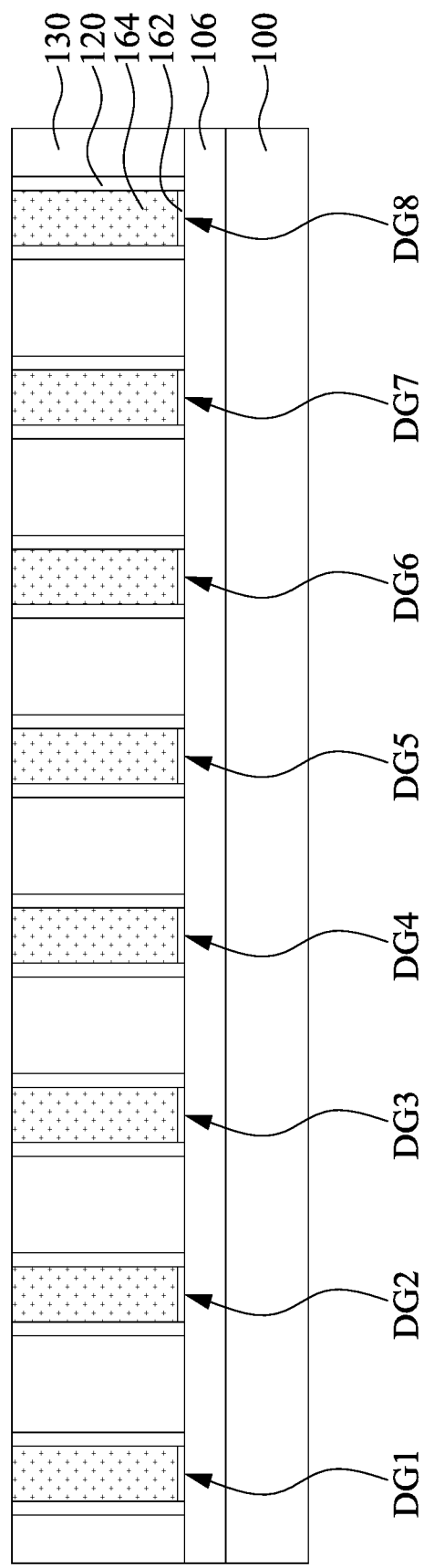

Reference is made to FIGS. 6A and 6B, in which FIGS. 6A and 6B follow FIGS. 5B and 5C, respectively. A plurality of source/drain structures SD1, SD2, SD3, SD4, and SD5 are formed in the active regions A1-A3. As an example in FIG. 12B, the active region A1 exposed by the dummy gate structures DG1-DG8 and the gate spacers 120 is recessed by suitable process, such as etching. Afterwards, the source/drain structures SD1-SD5 are formed respectively over the exposed surfaces of the remaining active region A1. The source/drain structures SD1-SD5 may be formed by performing an epitaxial growth process that grows an epitaxy semiconductor material from the active region A1. The source/drain structures SD1-SD5 are doped with an n-type impurity (e.g., phosphorous) or a p-type impurity (e.g., boron), depending on the conductivity-type of the respective resulting transistors.

An interlayer dielectric layer (ILD) 130 is formed adjacent to the gate spacers 120. For example, a dielectric layer is deposited blanket over the substrate 100 and filling the spaces between the gate spacers 120, followed by a CMP process to remove excessive material of the dielectric layer until the top surfaces of the dummy gate structures DG1-DG8 are exposed.

Figure 7B:
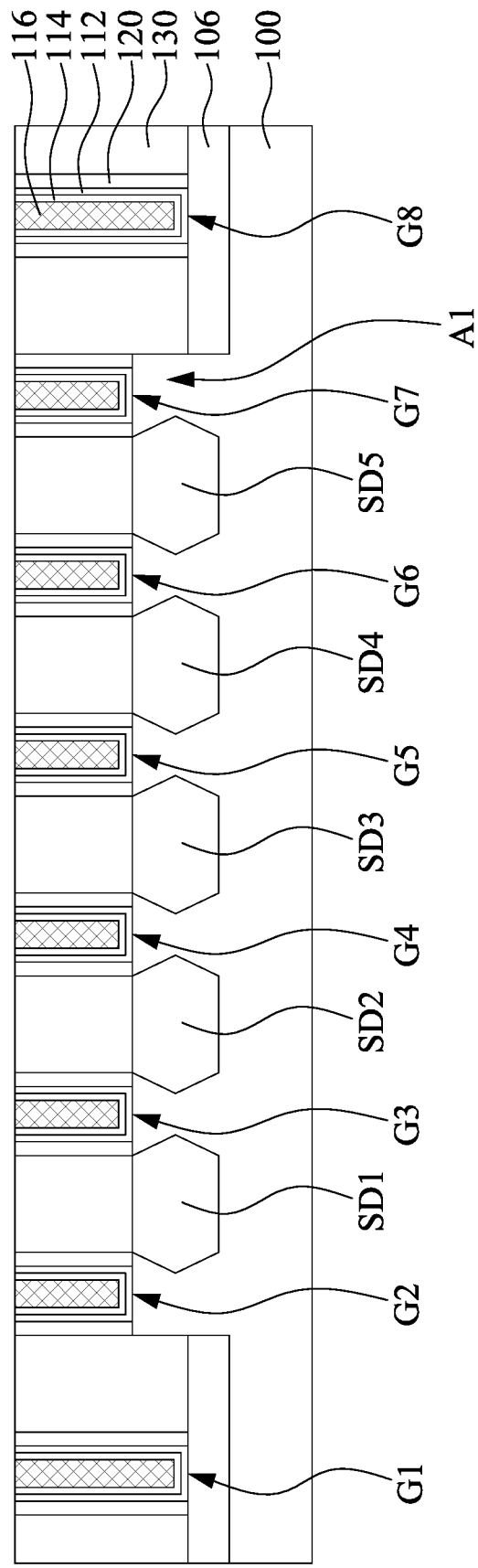
Figure 7C:
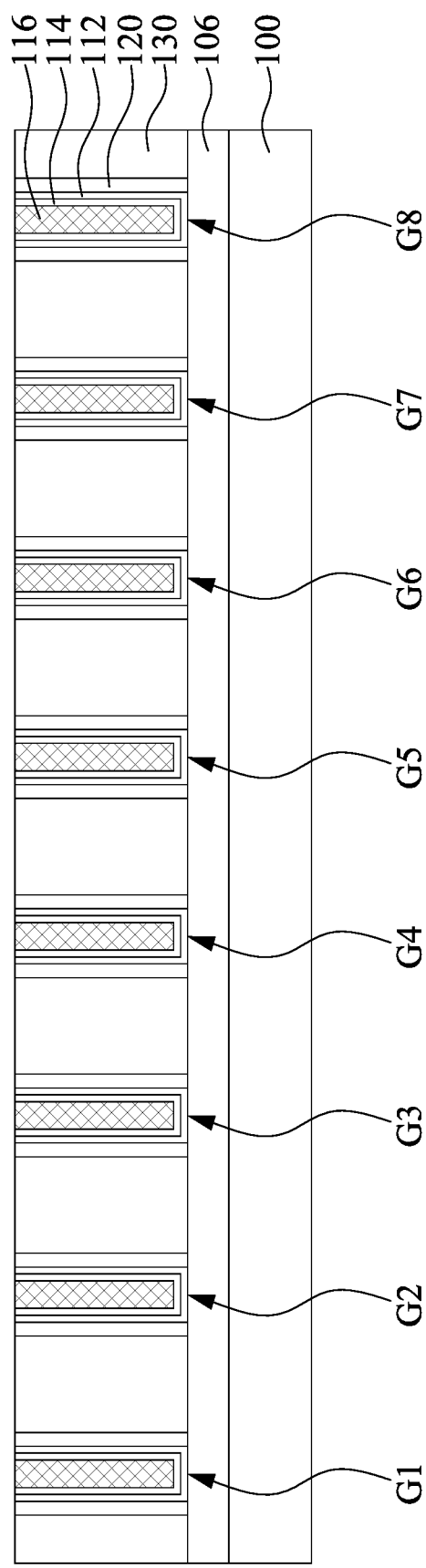

Reference is made to FIGS. 7A to 7C, in which FIG. 7B is a cross-sectional view along line B-B of FIG. 7A, and FIG. 7C is a cross-sectional view along line C-C of FIG. 7A. The dummy gate structures DG1-DG8 are replaced with metal gate structures G1, G2, G3, G4, G5, G6, G7, and G8.

In some embodiments, each of the gate structures G1-G8 includes a gate dielectric layer 112, a work function metal layer 114, and a filling metal 116. For example, the dummy gate structures DG1-DG8 are removed by an etching process to form gate trenches between the gate spacers 120, a gate dielectric material, a work function metal material, and a conductive material are formed sequentially in the gate trenches, followed by a CMP process to remove excessive materials of the gate dielectric material, the work function metal material, and the conductive material until the ILD layer 130 is exposed.

Figure 8A:
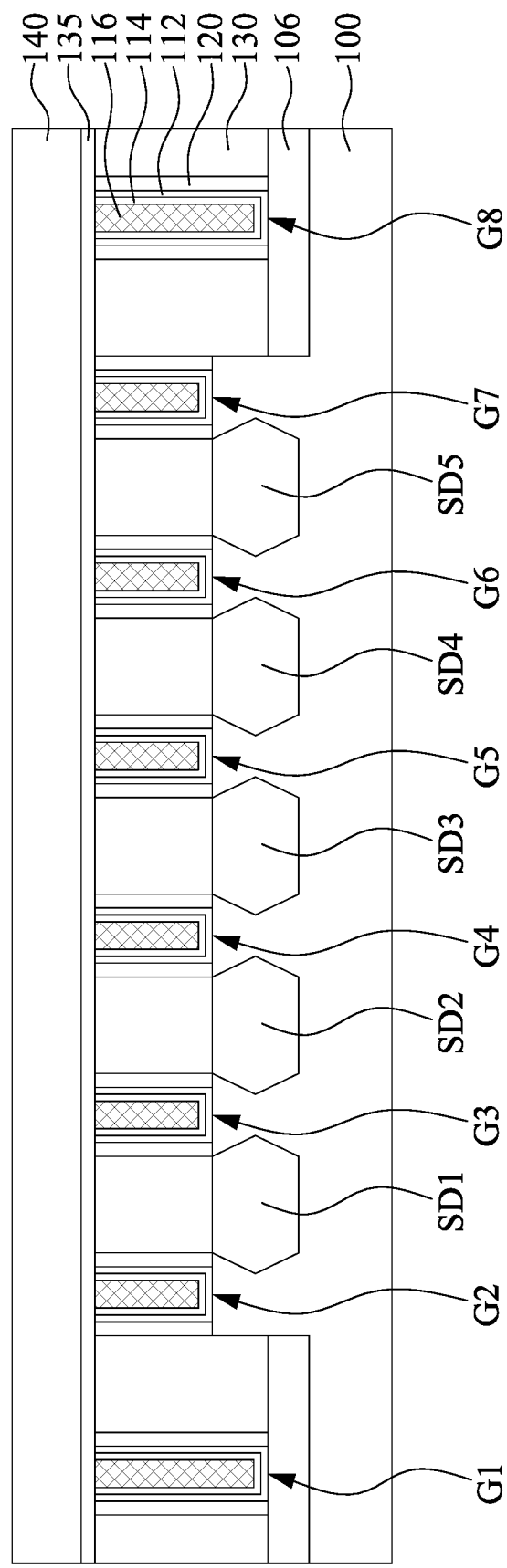
Figure 8B:
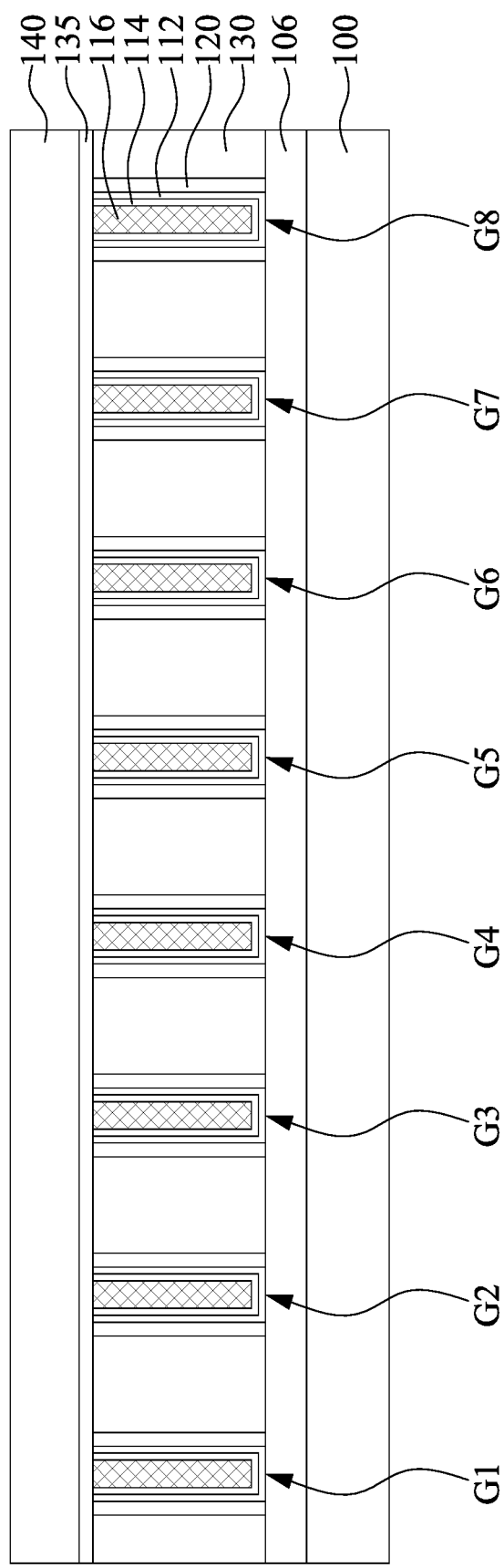

Reference is made to FIGS. 8A and 8B, in which FIGS. 8A and 8B follow FIGS. 7B and 7C, respectively. An etch stop layer (ESL) 135 and an interlayer dielectric layer (ILD) 140 are formed over the gate structures G1-G8. The ESL 135 can be formed using, for example, plasma enhanced CVD, low pressure CVD, ALD or other suitable techniques. The ILD layer 140 may be formed using, for example, CVD, ALD, spin-on-glass (SOG) or other suitable techniques.

Figure 9A:
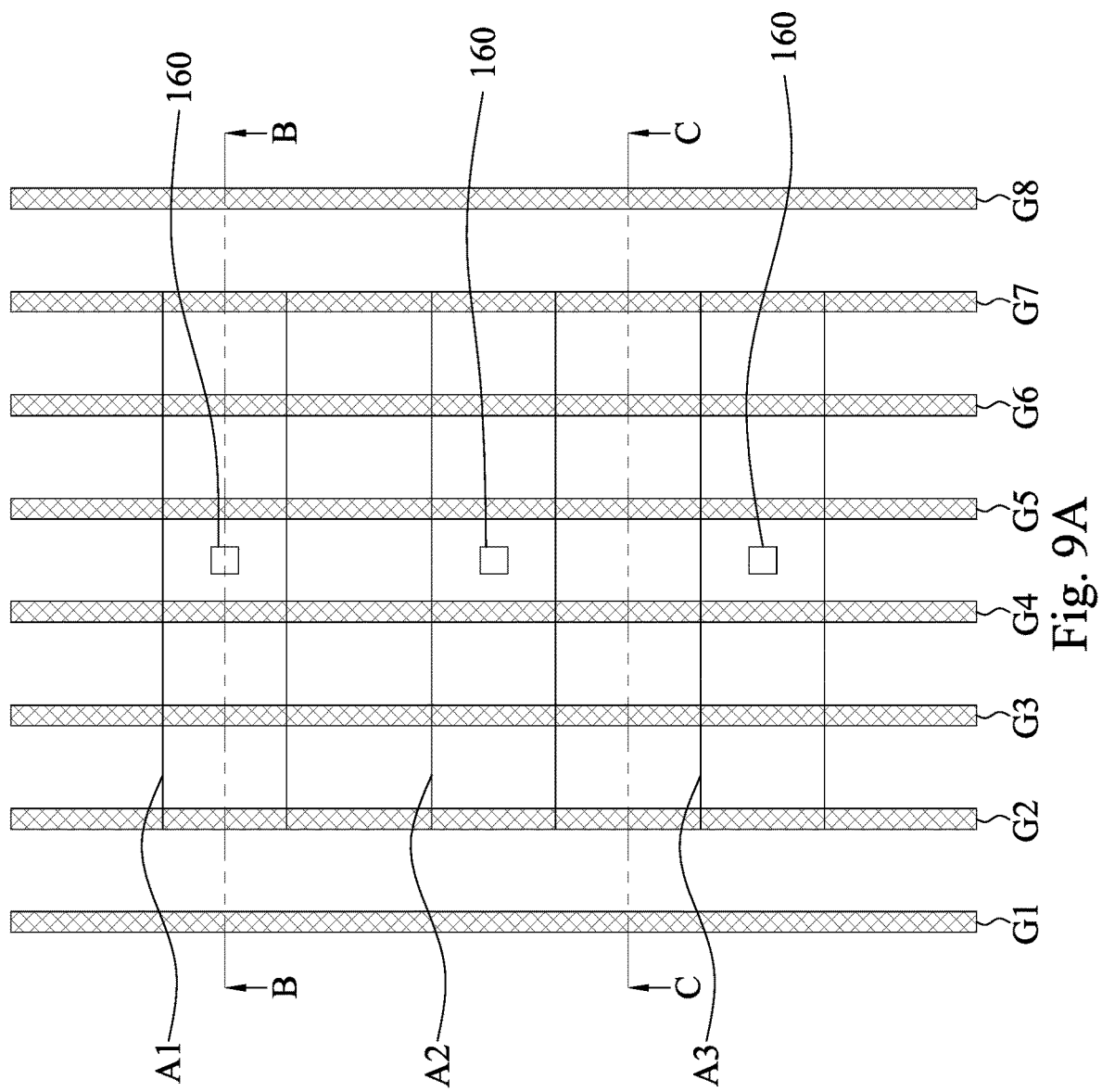
Figure 9B:
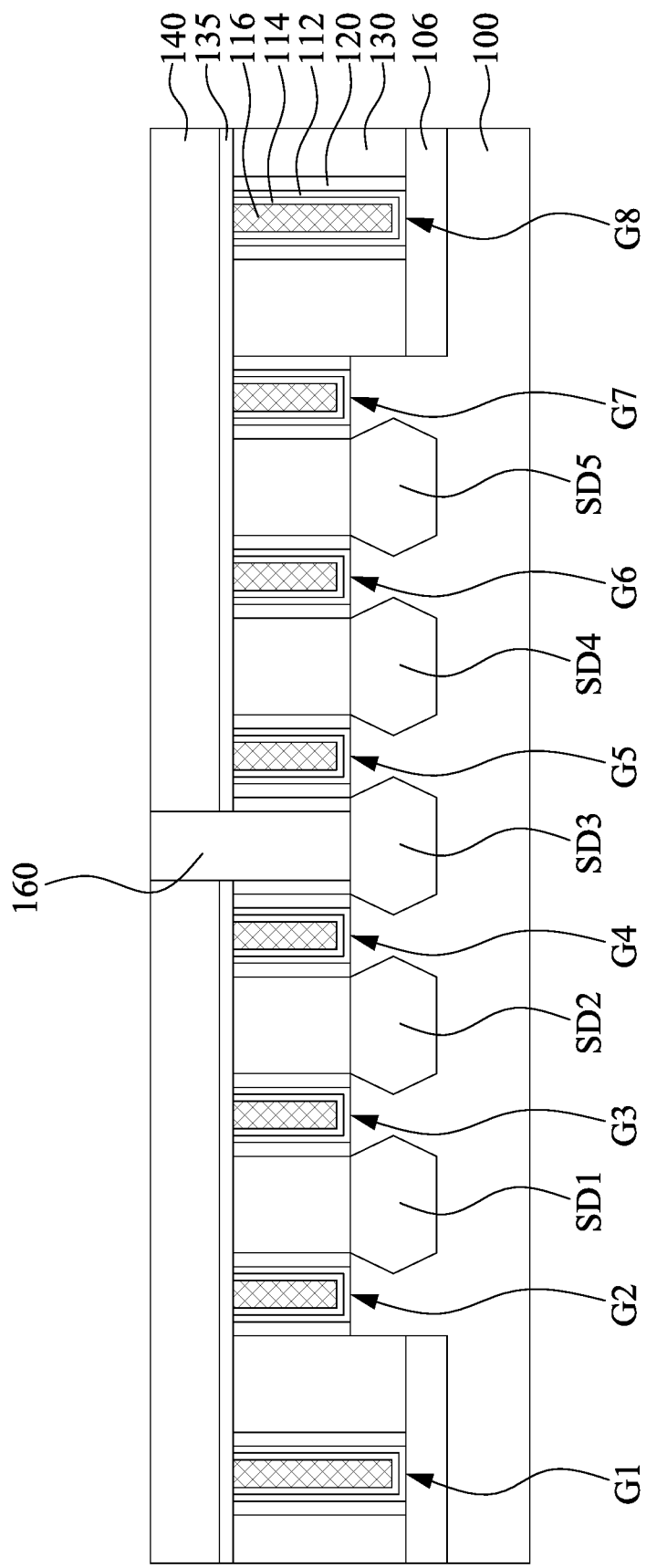
Figure 9C:
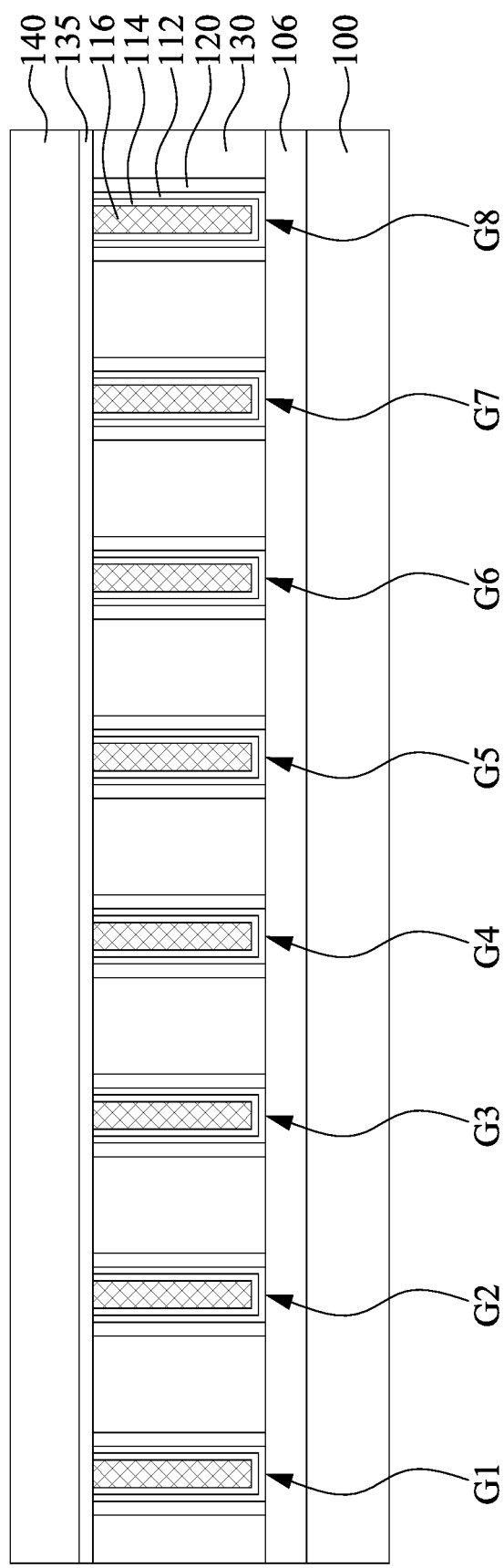

Reference is made to FIGS. 9A to 9C, in which FIG. 9B is a cross-sectional view along line B-B of FIG. 9A, and FIG. 9C is a cross-sectional view along line C-C of FIG. 9A. A plurality of source/drain contacts 160 are formed in contact with the source/drain structures. As an example of FIG. 9B, a source/drain contact 160 is formed in contact with the source/drain structure SD3. In some embodiments, the source/drain contacts 160 may be formed by, for example, etching the ILD layer 140, the ESL 135, and the ILD layer 130 to form openings that expose the source/drain structures, filling conductive material in the openings, followed by a CMF process to remove excessive material of the conductive material until a top surface of the ILD layer 140 is exposed.

Figure 10A:
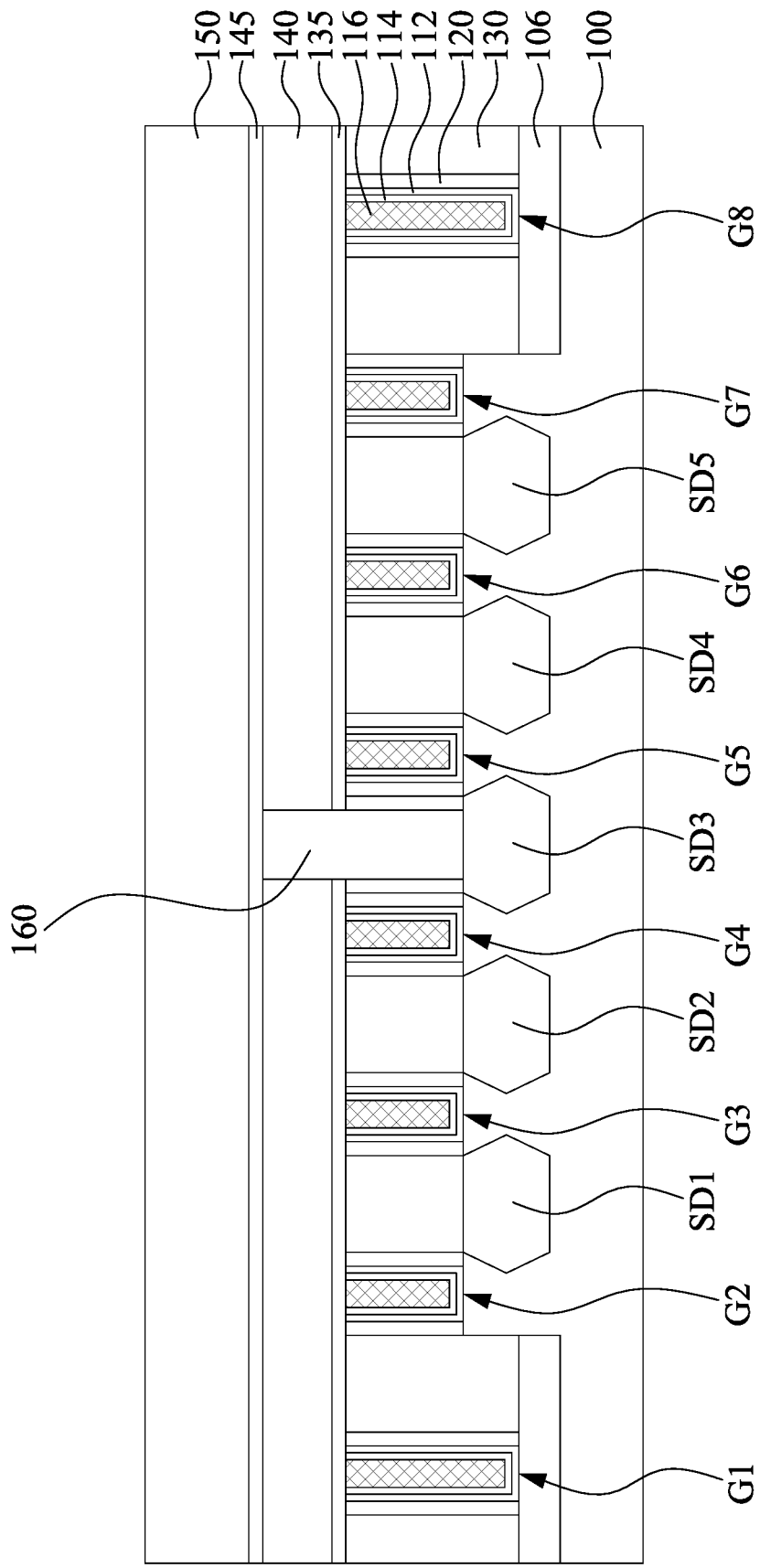
Figure 10B:
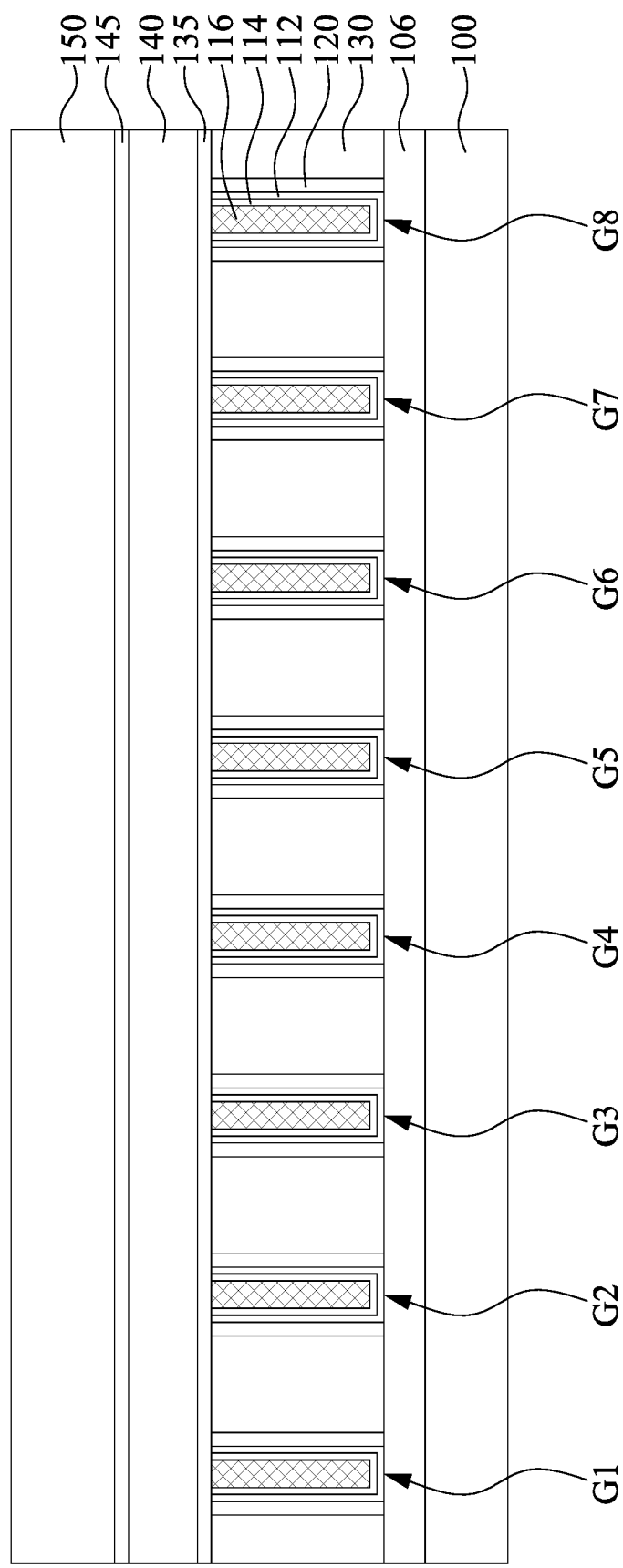

Reference is made to FIGS. 10A and 10B, in which FIGS. 10A and 10B follow FIGS. 9B and 9C, respectively. An etch stop layer (ESL) 145 and an interlayer dielectric layer (ILD) 150 are formed over the ILD layer 140. The ESL 135 can be formed using, for example, plasma enhanced CVD, low pressure CVD, ALD or other suitable techniques. The ILD layer 150 may be formed using, for example, CVD, ALD, spin-on-glass (SOG) or other suitable techniques.

Figure 11A:
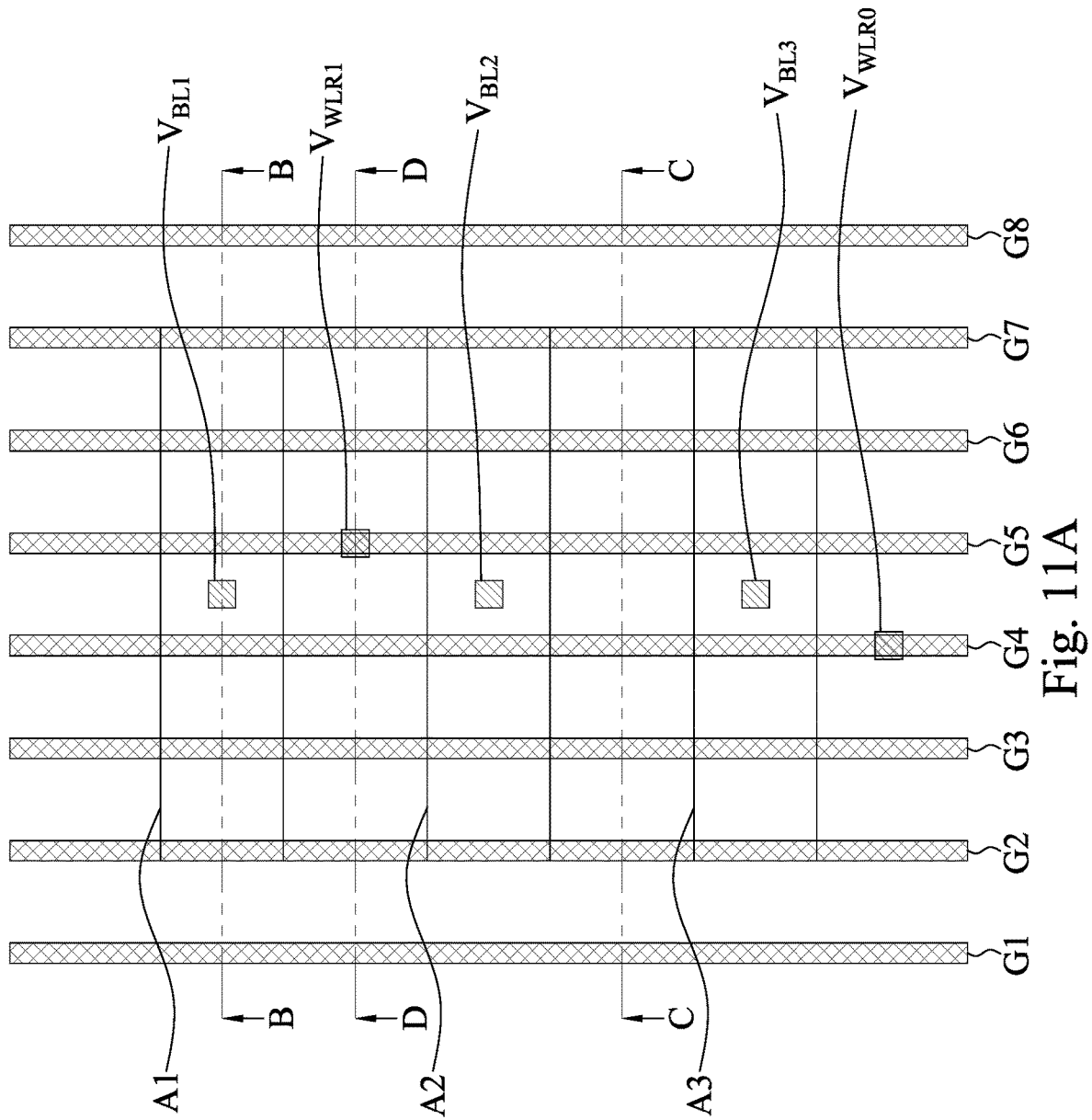
Figure 11B:
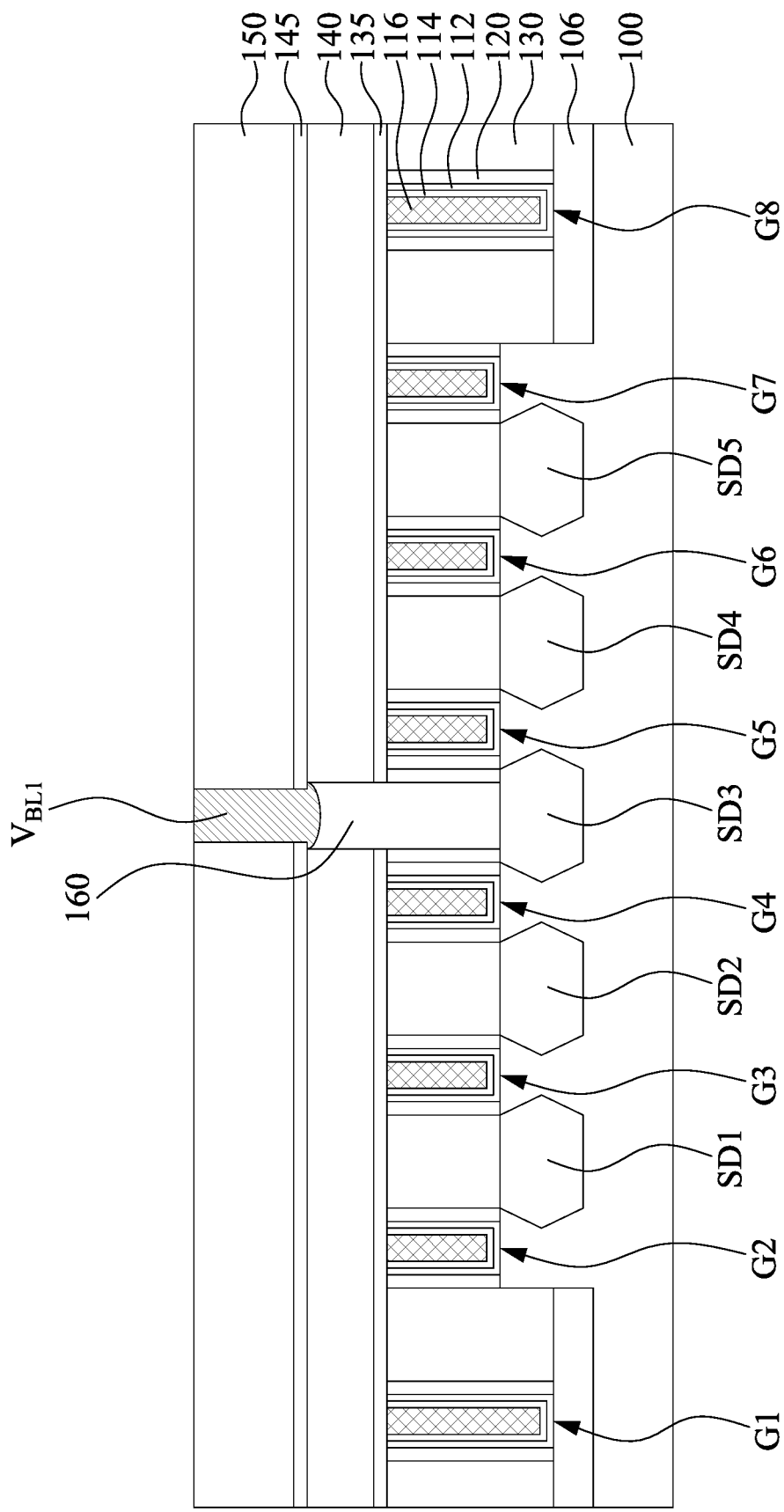
Figure 11C:
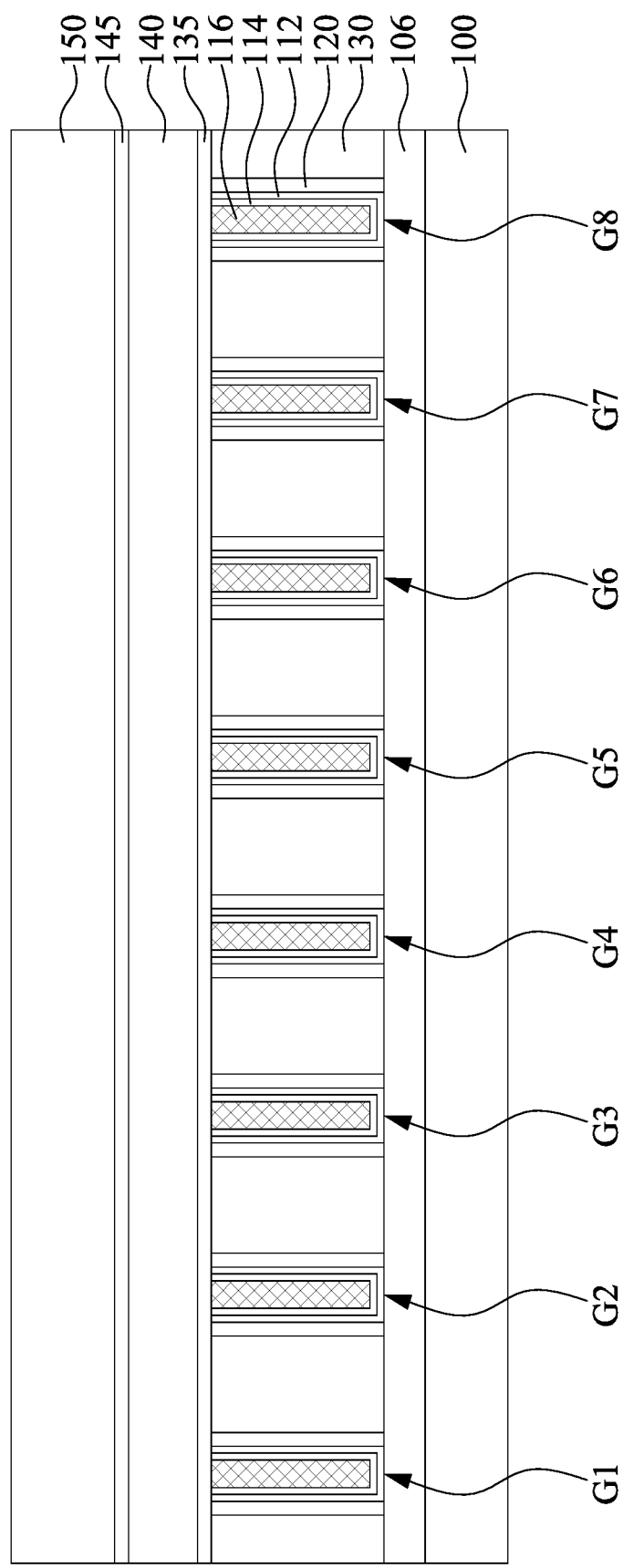
Figure 11D:
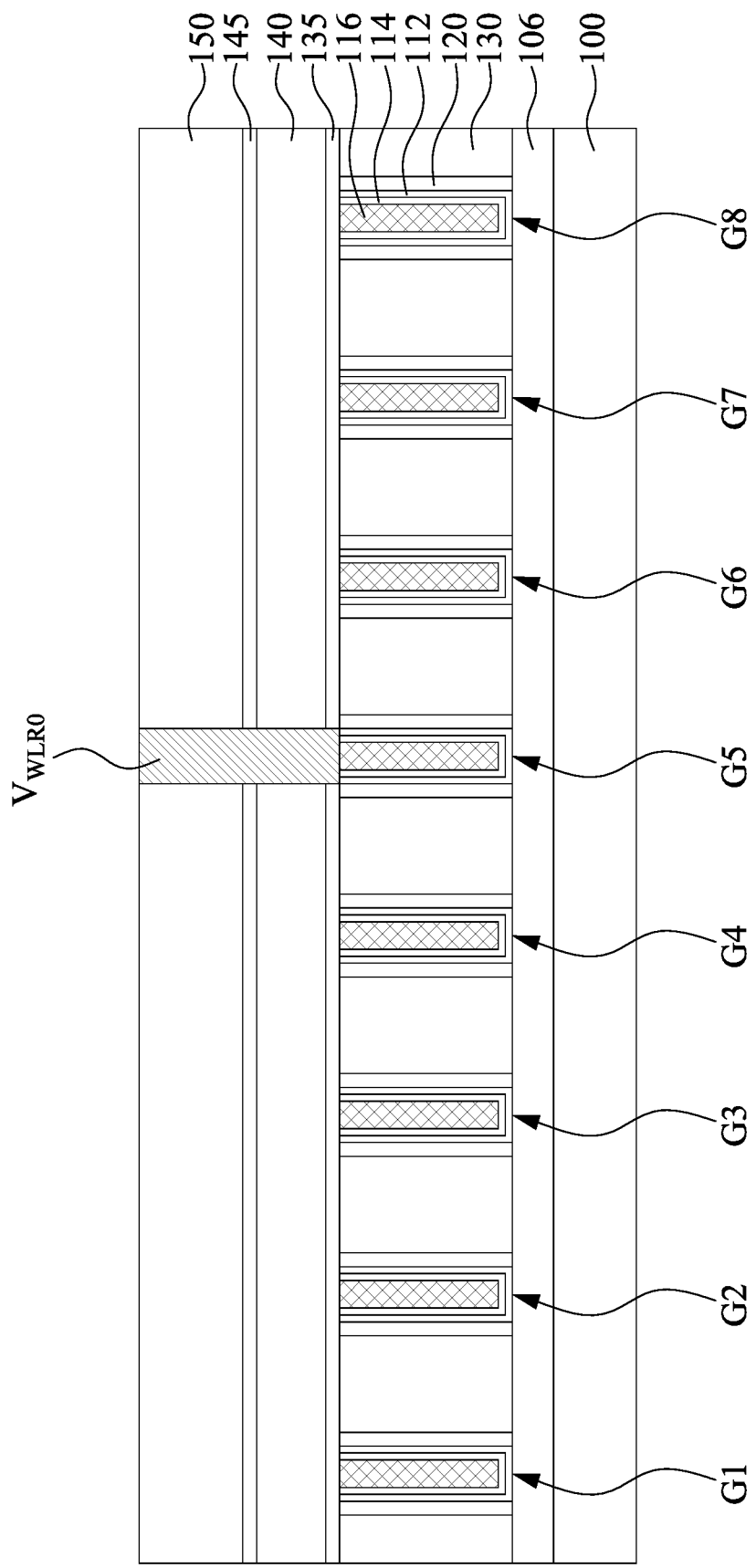

Reference is made to FIGS. 11A to 11C, in which FIG. 11B is a cross-sectional view along line B-B of FIG. 11A, FIG. 11C is a cross-sectional view along line C-C of FIG. 11A, and FIG. 11D is a cross-sectional view along line D-D of FIG. 11A. A plurality of vias $V_{BL1}$, $V_{BL2}$, $V_{BL3}$, $V_{WLR0}$, and $V_{WLR1}$ are formed. For example, the vias $V_{BL1}$, $V_{BL2}$, $V_{BL3}$, $V_{WLR0}$, and $V_{WLR1}$ may be formed by, etching the ESL 135, ILD layer 140, ESL 145, and ILD 150 to from openings, forming a conductive layer in the openings, followed by a CMP process to remove excessive conductive layer until top surface of the ILD 150 is exposed. As an example in FIG. 11B, the source/drain contact 160 has higher etching resistance to the etching process than the ESL 135, ILD layer 140, ESL 145, and ILD 150, thus the etching process stops at the source/drain contact 160, and therefore the via $V_{BL1}$ is landed on the source/drain contact 160. However, the etching process may still slightly etch the source/drain contact 160, which results in a curved top surface of the source/drain contact 160. Accordingly, the via $V_{BL1}$ slightly extends to a position below the bottom surface of the ESL 145.

Figure 12A:
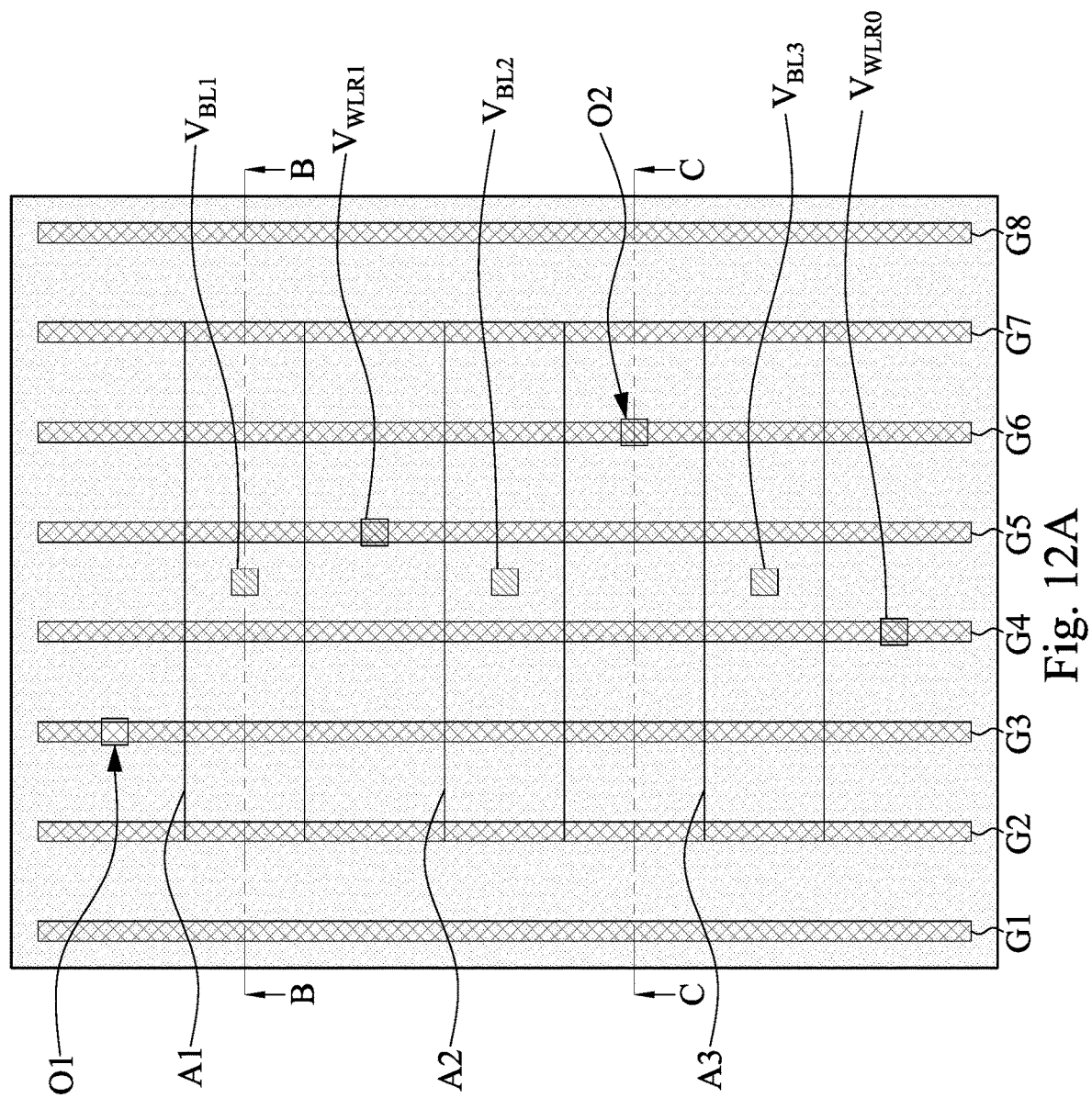
Figure 12B:
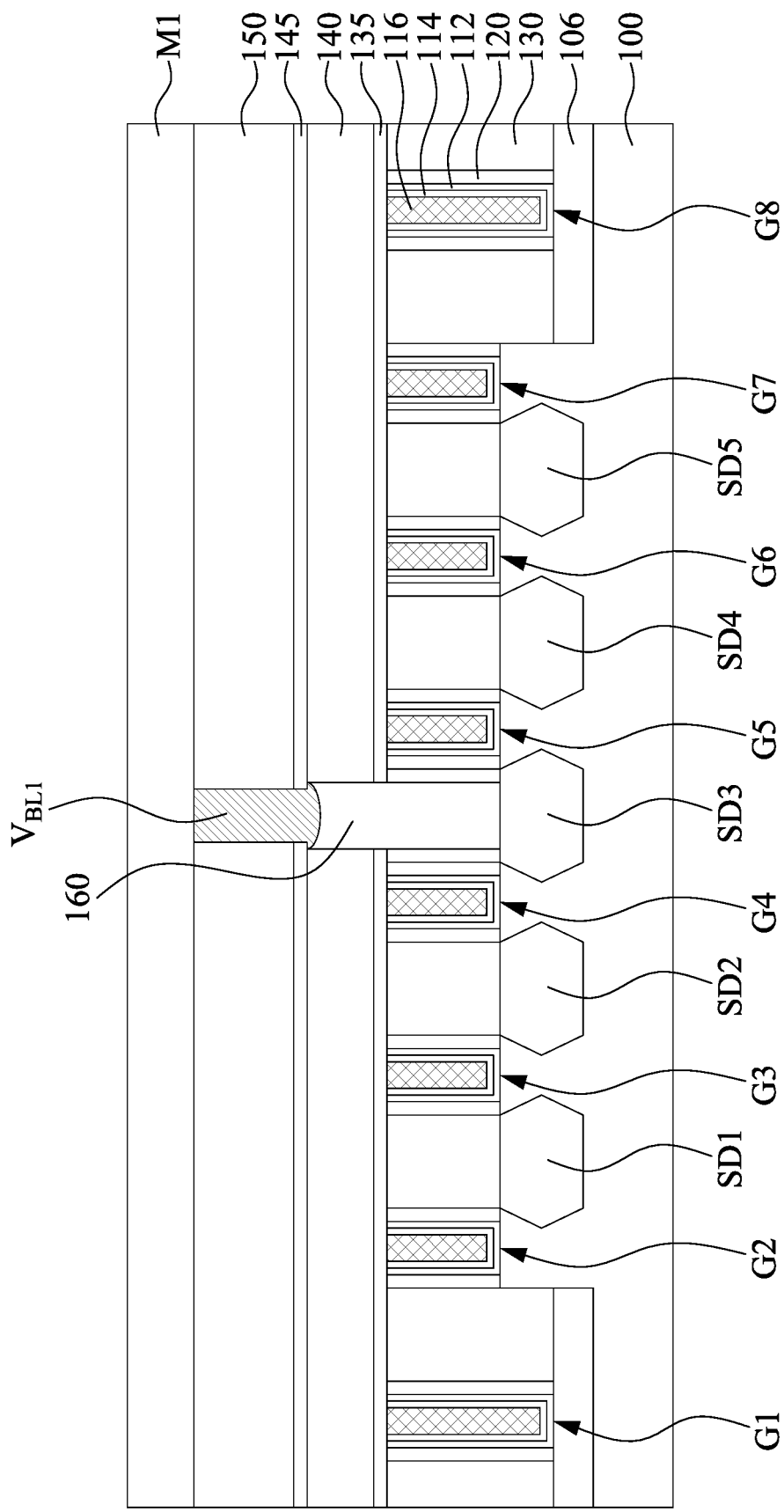
Figure 12C:
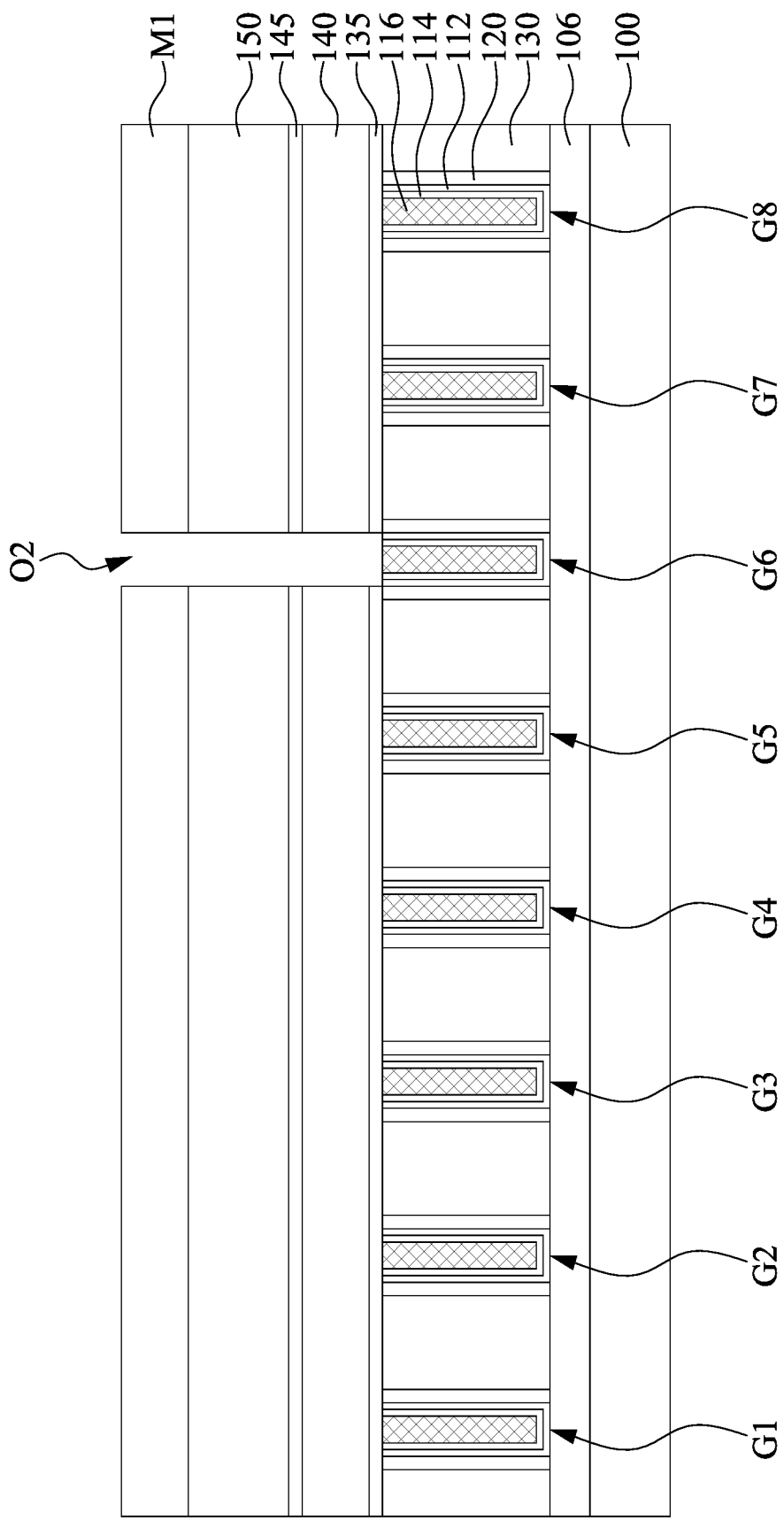

Reference is made to FIGS. 12A to 12C, in which FIG. 12B is a cross-sectional view along line B-B of FIG. 12A, and FIG. 12C is a cross-sectional view along line C-C of FIG. 12A. A patterned mask M1 is formed over the ILD layer 150, and the ESL 135, ILD layer 140, ESL 145, and ILD 150 are etched to form openings O1 and O2. In some embodiments, the openings O1 and O2 exposes the gate structures G3 and G6, respectively. In some embodiments, the patterned mask M1 covers the gate structures G1, G2, G4, G5, G7, and G8, and also covers the vias $V_{BL1}$, $V_{BL2}$, $V_{BL3}$, $V_{WLR0}$, and $V_{WLR1}$. The patterned mask M1 may be formed by photoresist coating (e.g., spin-on coating), soft baking, mask aligning, exposure, post-exposure baking, developing the photoresist, rinsing, drying (e.g., hard baking), and/or combinations thereof.

Figure 13:
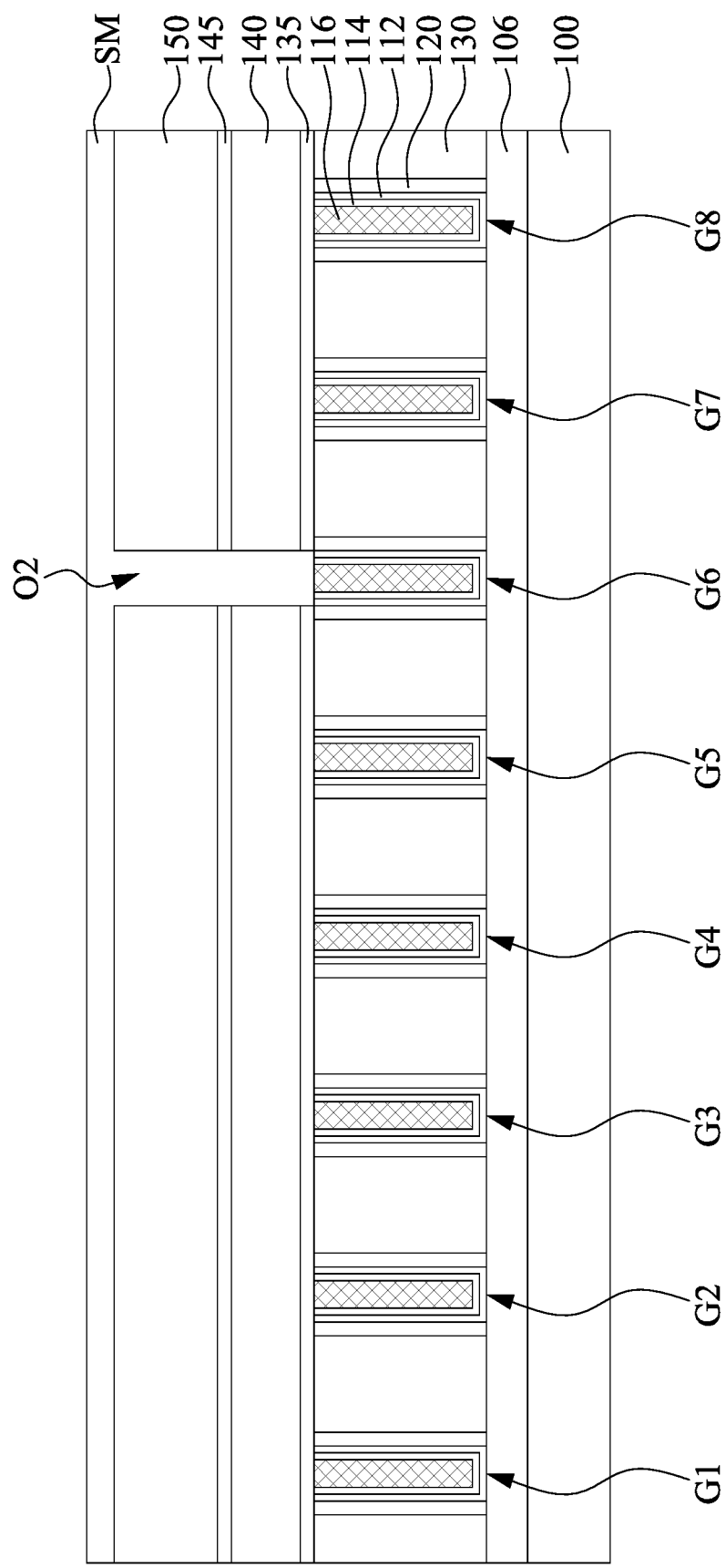

Reference is made to FIG. 13, in which FIG. 13 follows FIG. 12C. The patterned mask M1 is removed, and a semiconductor material SM is formed over the ILD layer 150 and in the opening O2. In some embodiments, the semiconductor material SM may be formed by suitable process, such as chemical vapor deposition (CVD), physical vapor deposition (PVD), atomic layer deposition (ALD), or any suitable process.

Figure 14:
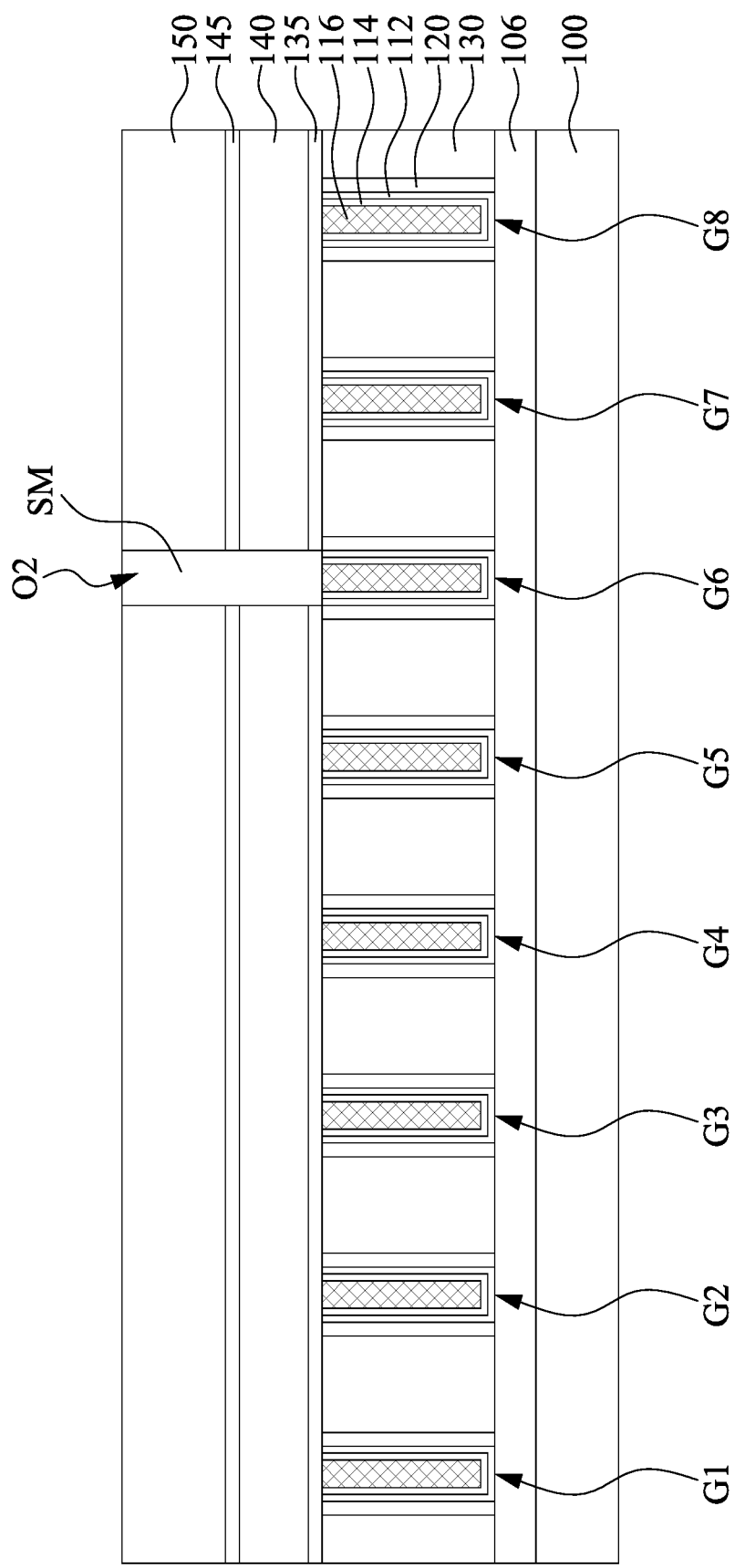

Reference is made to FIG. 14. A CMP process is performed to the semiconductor material SM until the top surface of the ILD layer 150 is exposed. After the CMP process, the top surface of the semiconductor material SM and the top surface of the ILD layer 150 are substantially coplanar.

Figure 15:
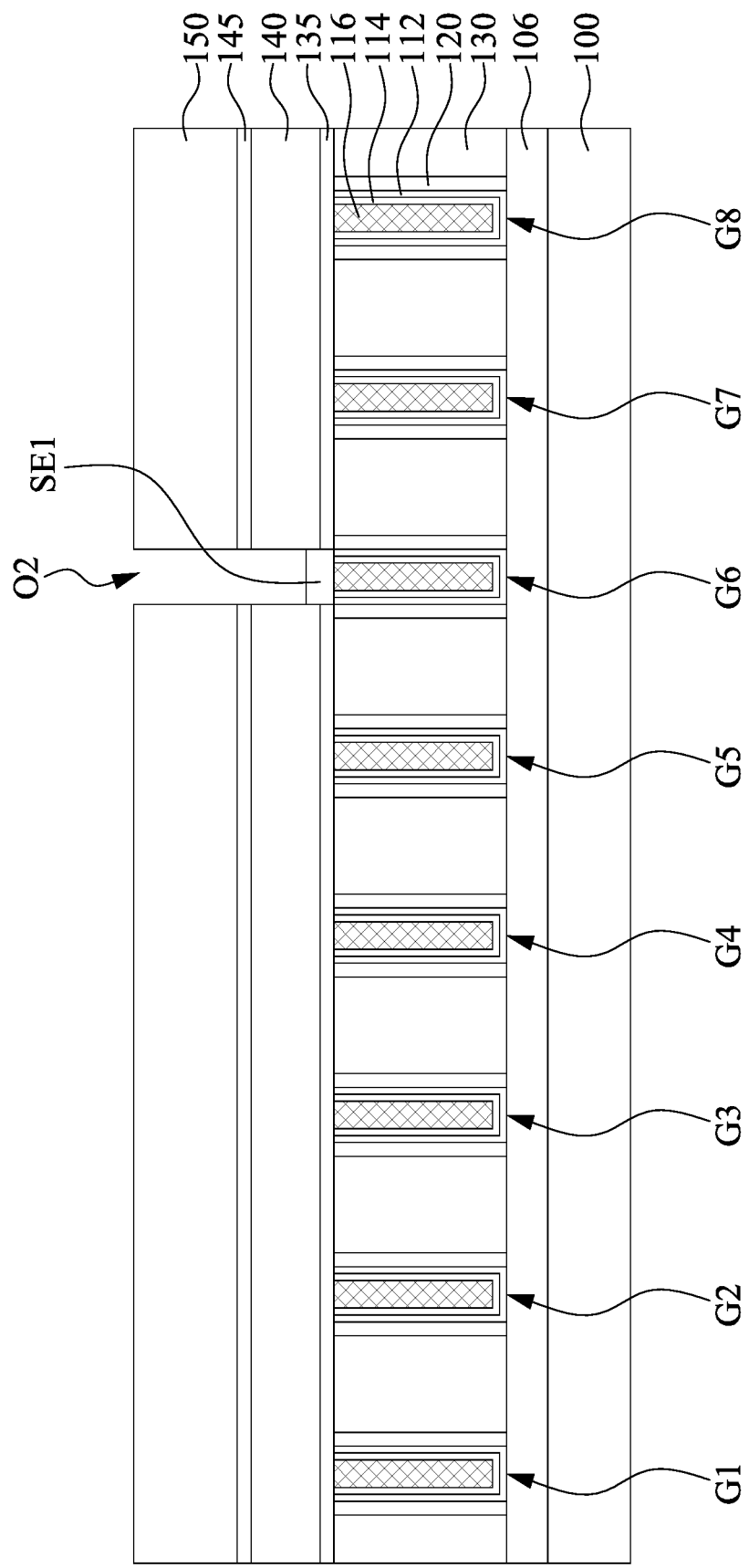

Reference is made to FIG. 15. The semiconductor material SM is etched back to form a semiconductor layer SE1. In some embodiments, the semiconductor material SM is etched back using suitable process, such as dry etch, wet etch, or combinations thereof, which uses an etchant that selectively etches the semiconductor material SM at a faster etch rate than it etches the oxide material of the ILD layer 150. In this way, the semiconductor material SM is pulled back to a level lower than a top surface of the ILD layer 150. It is noted that the semiconductor layer SE2 described in FIG. 4E is formed at the same time and with the same method as the semiconductor layer SE1 with respect to the processes discussed in FIGS. 13 to 15.

Figure 16:
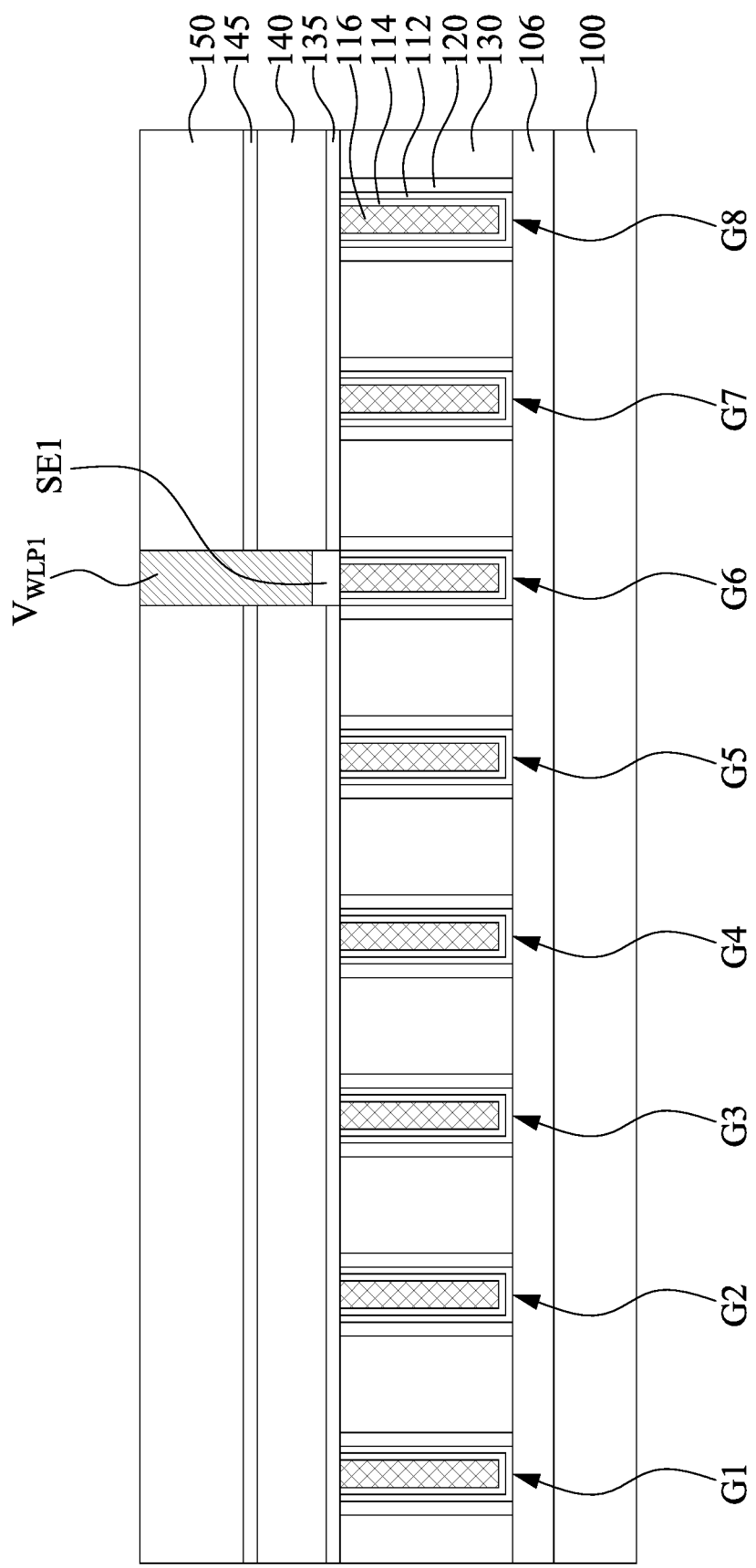

Reference is made to FIG. 16, a via $V_{WLP1}$ is formed in the opening O2 and over the semiconductor layer SE1. The via $V_{WLP1}$ may be formed by, depositing a conductive layer in the opening O2, followed by a CMP process to remove excessive conductive layer until top surface of the ILD layer 150 is exposed. It is noted that the via $V_{WLP0}$ described in FIG. 4F is formed at the same time and with the same method as the via $V_{WLP1}$ described herein.

Figure 17A:
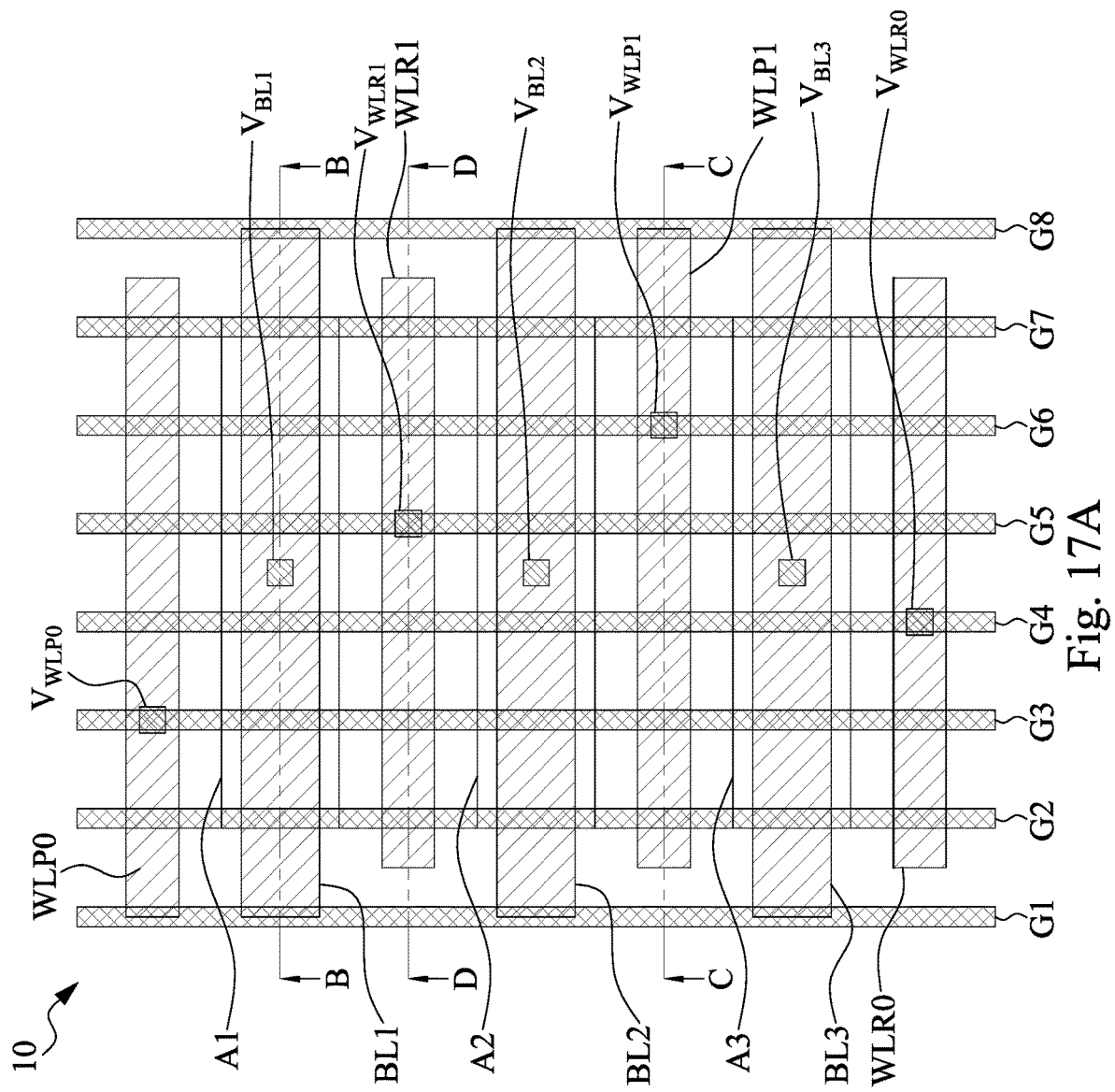
Figure 17B:
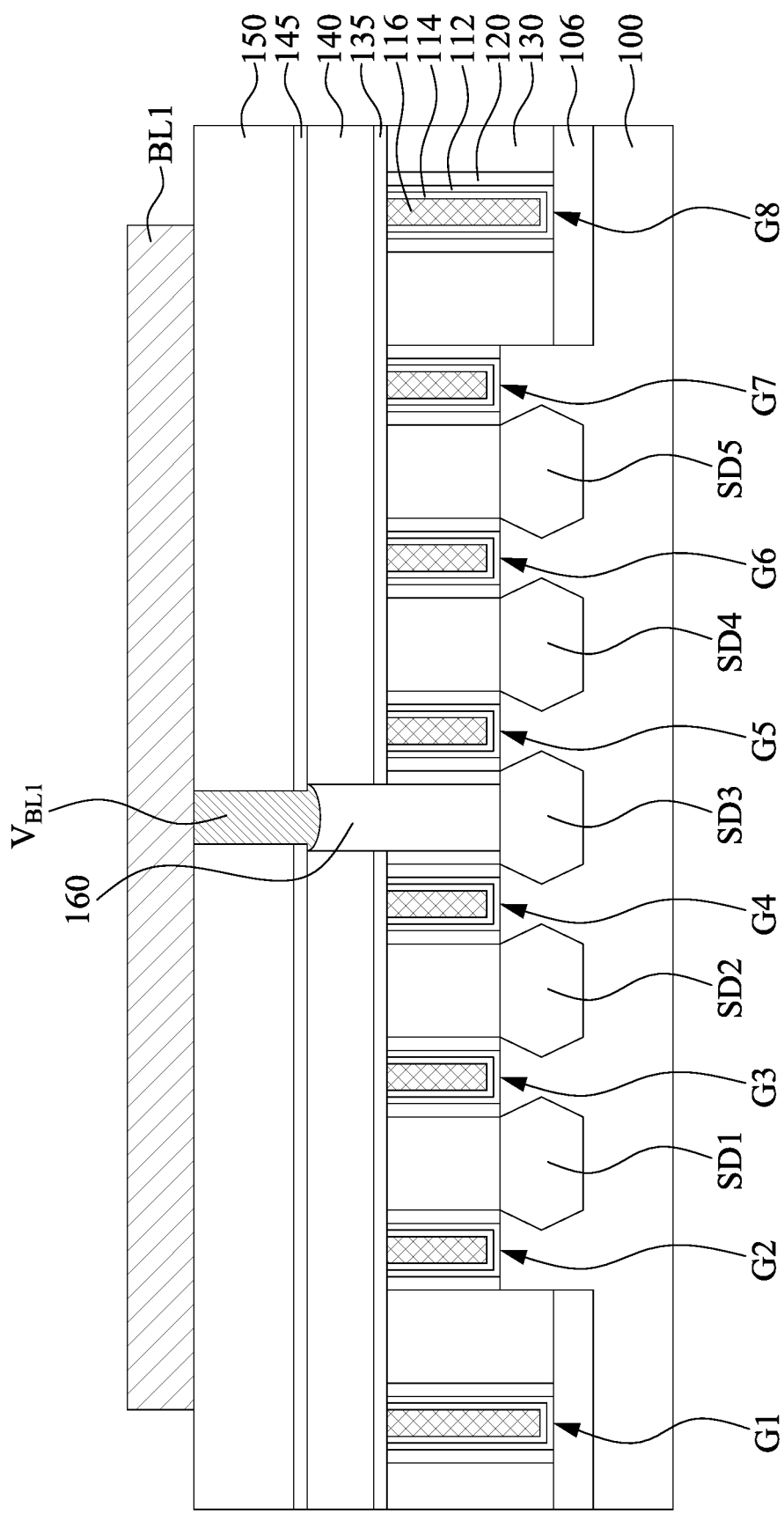
Figure 17C:
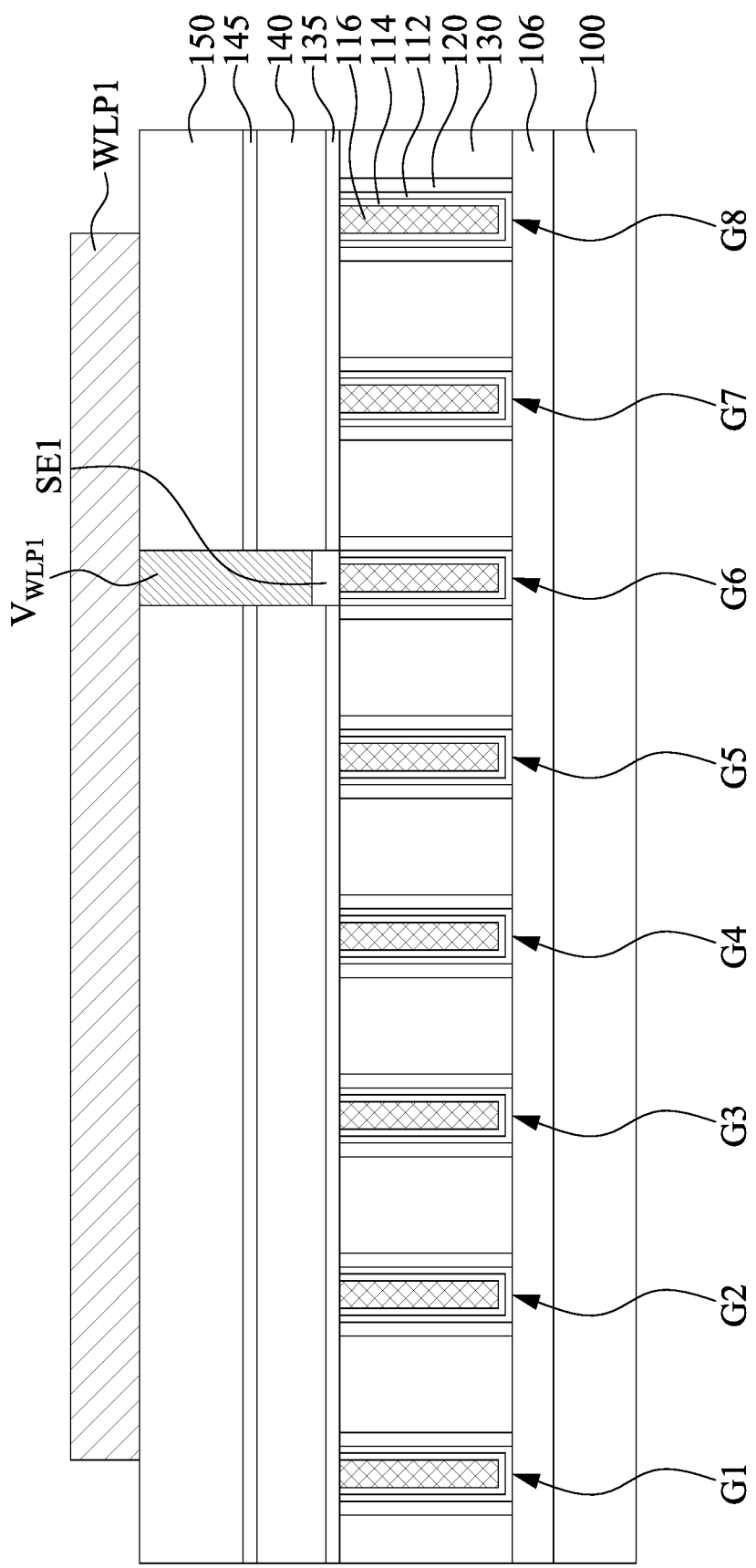
Figure 17D:
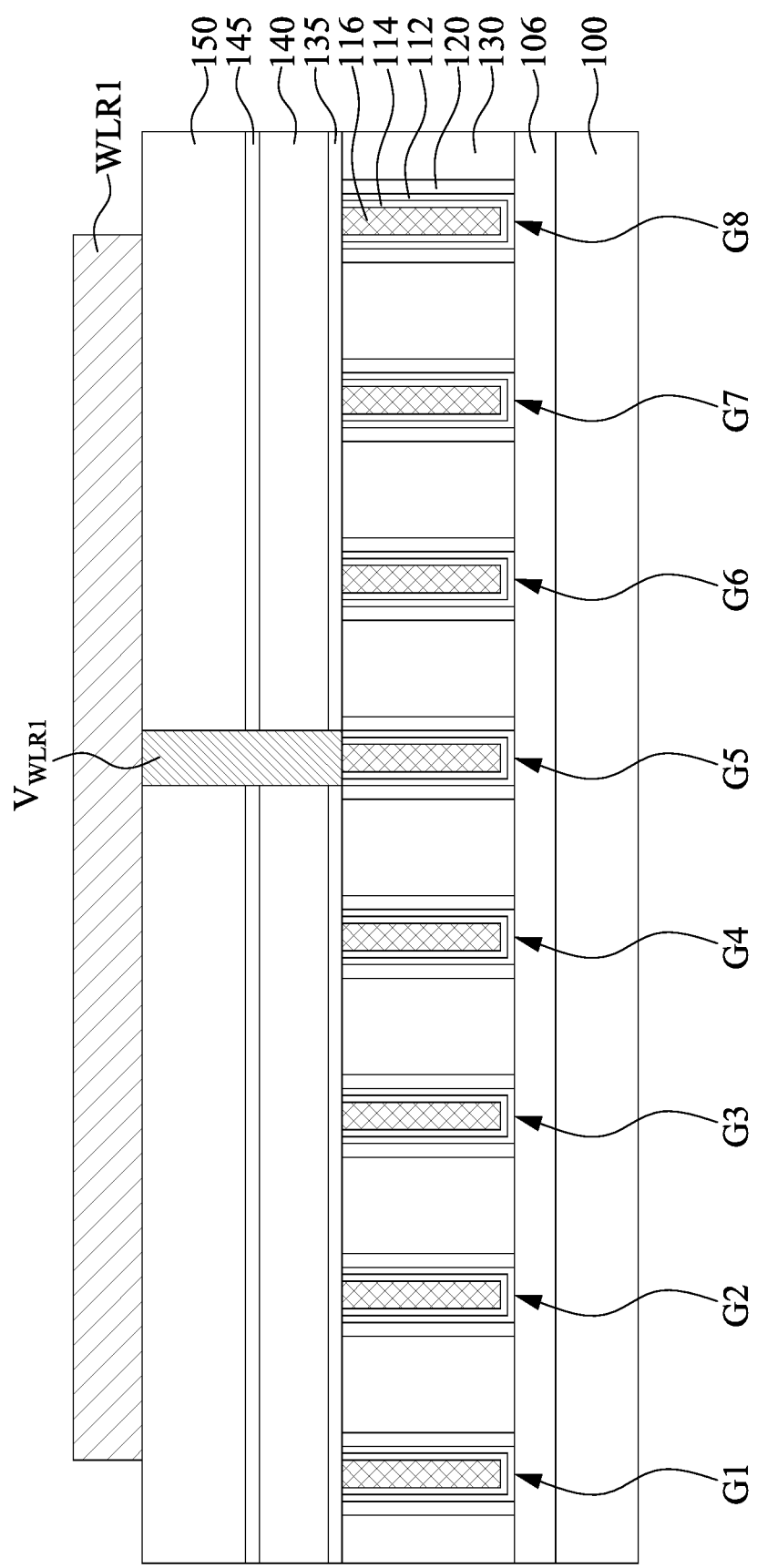

Reference is made to FIGS. 17A to 17D, in which FIG. 17B is a cross-sectional view along line B-B of FIG. 17A, FIG. 17C is a cross-sectional view along line C-C of FIG. 17A, and FIG. 17D is a cross-sectional view along line D-D of FIG. 17A. Bit lines BL1, BL2, and BL3 and word lines WLP0, WLR0, WLP1, and WLR1 are formed over the ILD layer 150. For example, a conductive layer is deposited over the ILD layer 150, and the conductive layer is patterned according to a predetermined pattern. As a result, the portions of the remaining conductive layer over the vias $V_{BL1}$, $V_{BL2}$, $V_{BL3}$, $V_{WLP0}$, $V_{WLR0}$, $V_{WLP1}$, and $V_{WLR1}$ are referred to as the bit lines BL1, BL2, and BL3 and word lines WLP0, WLR0, WLP1, and WLR1, respectively.

Figures 18A, 18B, 18C:
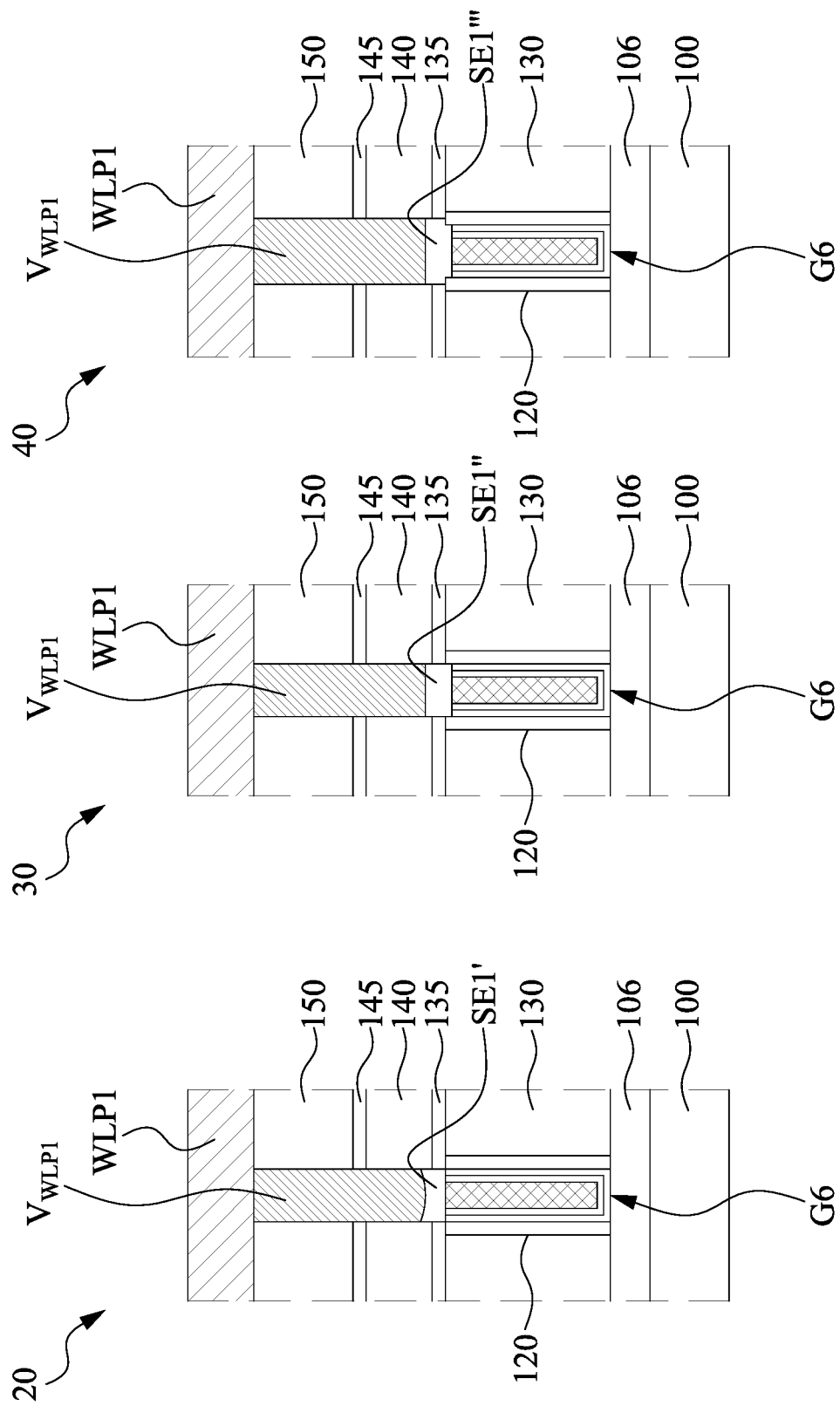
FIGS. 18A to 18C are cross-sectional views of memory devices in accordance with some embodiments.

FIGS. 18A to 18C are cross-sectional views of memory devices in accordance with some embodiments. It is noted that the memory devices 20, 30, and 40 of FIGS. 18A, 18B, and 18C are similar to the memory device 10 as described in FIGS. 4A-4G, and thus similar elements are labeled the same and structural details will not be repeated for brevity. In greater detail, memory devices 20, 30, and 40 of FIGS.

18A, 18B, and 18C have semiconductor layer SE1', SE1", and SE1''' that have structures different from the semiconductor layer SE1 in FIG. 4C.

Reference is made to FIG. 18A, the memory device 20 is different from the memory device 10 as described in FIGS. 4A-4G, in that a semiconductor layer SE1' has a concave top surface. Stated another way, the top surface of the semiconductor layer SE1' is curved. For example, as illustrated in FIG. 15, during etching back the semiconductor material SM (see FIG. 14), the etchant may flow into the opening O2 to etch the semiconductor material SM, and this will result in the concave top surface of the semiconductor layer SE1' in some embodiments. Accordingly, the interface between the semiconductor layer SE1' and the via $V_{WLP1}$ may also be a curved interface.

Reference is made to FIG. 18B, the memory device 30 is different from the memory device 10 as described in FIGS. 4A-4G, in that a semiconductor layer SE1" extends between the gate spacers 120. For example, as illustrated in FIG. 12C, during forming the opening O2, the etching process may also slightly etch the gate structure G6, such that the top surface of the gate structure G6 is lowered. Accordingly, the semiconductor layer (e.g., semiconductor layer SE1") may be formed in between the gate spacers 120, and the resulting structure is shown in FIG. 18B. In some embodiments, the bottom surface of the semiconductor layer SE1" is lower than the top surface of the gate spacers 120, while the top surface of the semiconductor layer SE1" is higher than the top surface of the gate spacers 120.

Reference is made to FIG. 18C, the memory device 40 is different from the memory device 10 as described in FIGS. 4A-4G, in that a semiconductor layer SE1''' has a wildest width greater than a width of the gate structure G6, and the semiconductor layer SE1''' extends to between the gate spacers 120. For example, as illustrated in FIG. 12C, during forming the opening O2, a width of the opening O2 may be larger than the gate structure G6, such that the opening O2 may expose the top surfaces of the gate spacers 120. On the other hand, the etching process may also slightly etch the gate structure G6, such that the top surface of the gate structure G6 is lowered. The resulting structure is shown as the semiconductor layer SE1''' in FIG. 18C. In some embodiments, the semiconductor layer SE1''' has a T-shape cross-section. In greater detail, the semiconductor layer SE1''' has an upper portion and a lower portion, in which the upper portion is wider than the lower portion. In some embodiments, the upper portion of the semiconductor layer SE1''' is wider than the gate structure G6 and contacts the top surfaces of the gate spacers 120, while the lower portion of the semiconductor layer SE1''' is in between the gate spacers 120 and contacts sidewalls of the gate spacers 120.

Figure 19A:
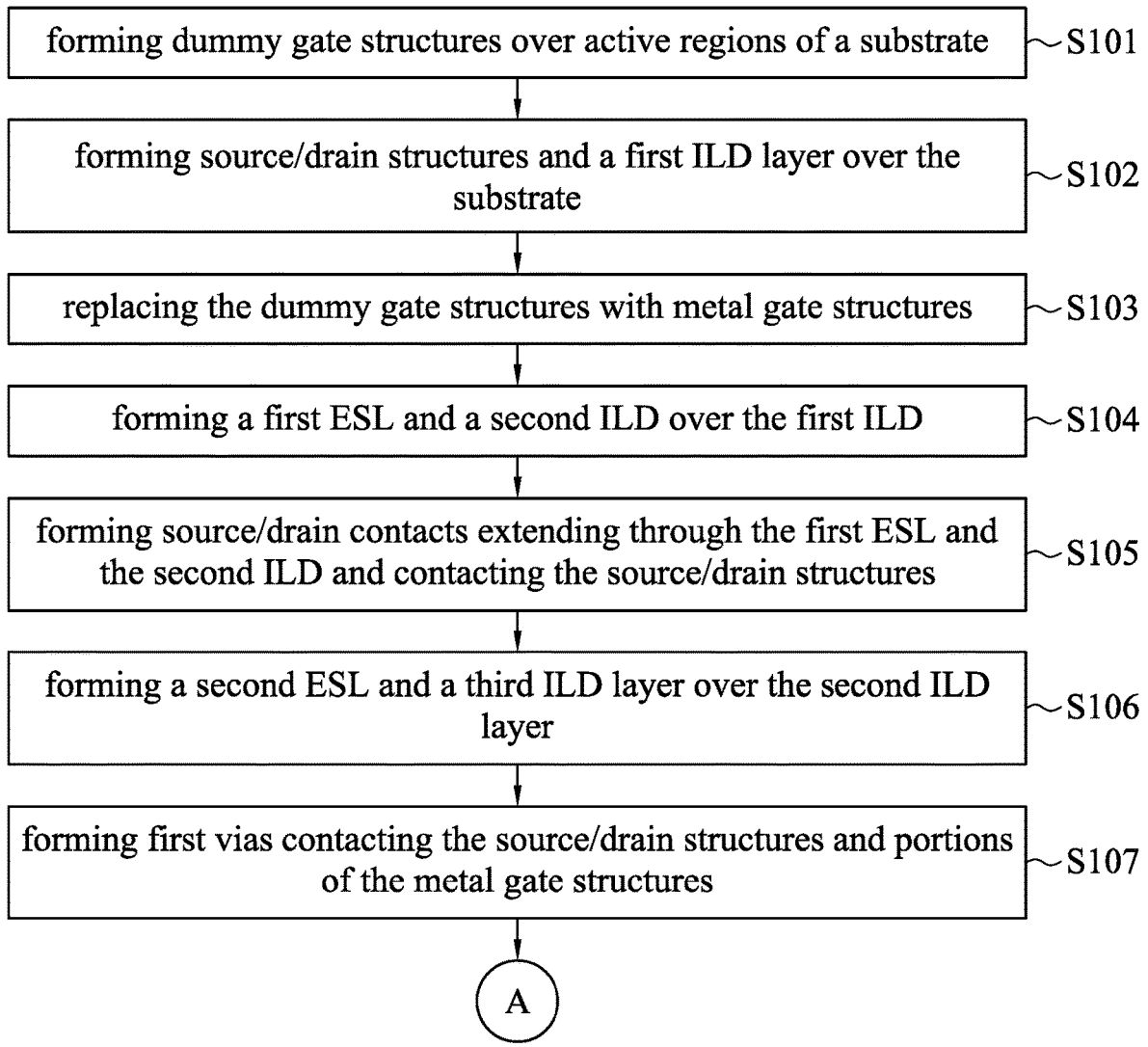
FIGS. 19A and 19B illustrate a method of manufacturing a memory device in accordance with some embodiments of the present disclosure.
Figure 19B:
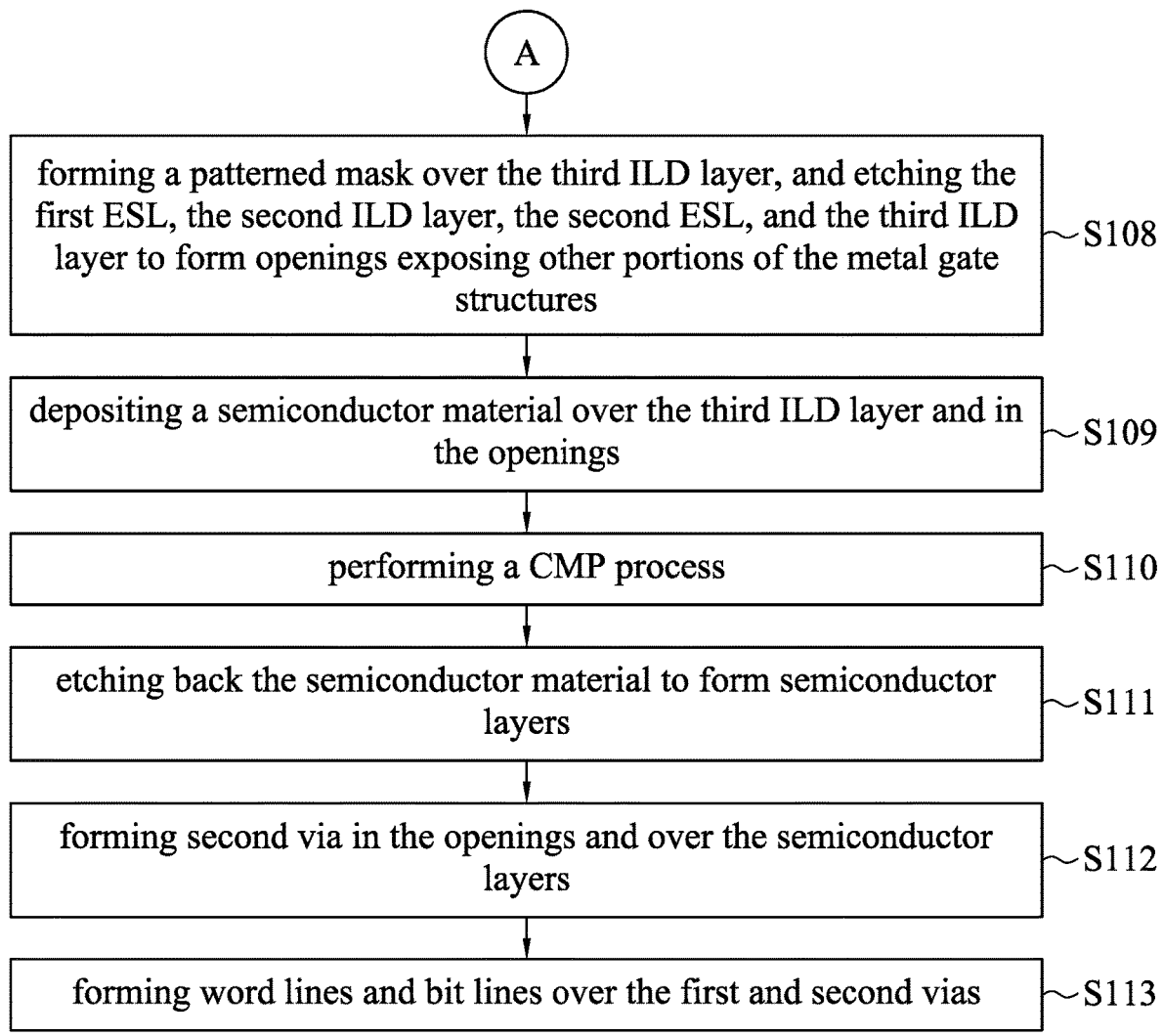

FIGS. 19A and 19B illustrate a method 1000 of manufacturing a memory device in accordance with some embodiments of the present disclosure. Although the method 1000 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, forming dummy gate structures over active regions of a substrate. FIGS. 5A to 5C illustrate schematic views of some embodiments corresponding to act in block S101.

At block S102, forming source/drain structures and a first ILD layer over the substrate. FIGS. 6A and 6B illustrate schematic views of some embodiments corresponding to act in block S102.

At block S103, replacing the dummy gate structures with metal gate structures. FIGS. 7A to 7C illustrate schematic views of some embodiments corresponding to act in block S103.

At block S104, forming a first ESL and a second ILD over the first ILD. FIGS. 8A and 8B illustrate schematic views of some embodiments corresponding to act in block S104.

At block S105, forming source/drain contacts extending through the first ESL and the second ILD and contacting the source/drain structures. FIGS. 9A to 9C illustrate schematic views of some embodiments corresponding to act in block S105.

At block S106, forming a second ESL and a third ILD layer over the second ILD layer. FIGS. 10A and 10B illustrate schematic views of some embodiments corresponding to act in block S106.

At block S107, forming first vias contacting the source/drain structures and portions of the metal gate structures. FIGS. 11A to 11C illustrate schematic views of some embodiments corresponding to act in block S107.

At block S108, forming a patterned mask over the third ILD layer, and etching the first ESL, the second ILD layer, the second ESL, and the third ILD layer to form openings exposing other portions of the metal gate structures. FIGS. 12A to 12C illustrate schematic views of some embodiments corresponding to act in block S108.

At block S109, depositing a semiconductor material over the third ILD layer and in the openings. FIG. 13 illustrates a schematic view of some embodiments corresponding to act in block S109.

At block S110, performing a CMP process. FIG. 14 illustrates a schematic view of some embodiments corresponding to act in block S110.

At block S111, etching back the semiconductor material to form semiconductor layers. FIG. 15 illustrates a schematic view of some embodiments corresponding to act in block S111.

At block S112, forming second vias in the openings and over the semiconductor layers. FIG. 16 illustrates a schematic view of some embodiments corresponding to act in block S112.

At block S113, forming word lines and bit lines over the first and second vias. FIGS. 17A to 17C illustrate schematic views of some embodiments corresponding to act in block S113.

Figure 20:
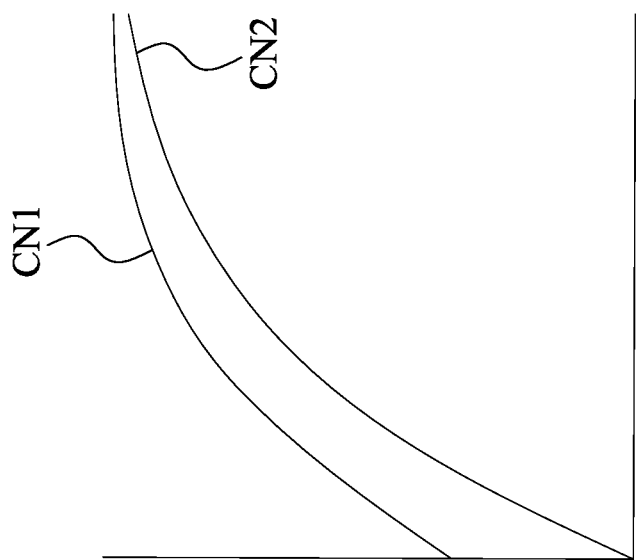
FIG. 20 illustrates simulation results of reduction of leakage current of an OTP memory cell by introducing a Schottky diode word lines and transistors of OTP memory cells in accordance with some embodiments of the present disclosure.

FIG. 20 illustrates simulation results of reduction of leakage current of a OTP memory cell by introducing a Schottky diode word lines and transistors of OTP memory cells, in which the current is shown on the vertical axis in FIG. 20, and the voltage is shown on the lateral axis in in FIG. 20. Conditions CN1 and CN2 illustrate simulation results of the OTP memory cells. The difference between Conditions CN1 and CN2 is that Condition CN1 is a simulation result of an OTP memory cell without the Schottky diodes D, and Condition CN2 is a simulation result of an OTP memory cell with the Schottky diodes D (such as OTP memory cell discussed in FIGS. 1 to 17D). Comparing Condition CN1 with Condition CN2, it is clear that forming a Schottky diodes D between the word line and the transistor of an OTP memory cell can reduce the leakage current of the OTP memory cell. In some embodiments, the leakage current can be reduced by about 100 times.

According to the aforementioned embodiments, it can be seen that the present disclosure offers advantages in fabricating semiconductor devices. It is understood, however, that other embodiments may offer additional advantages, and not all advantages are necessarily disclosed herein, and that no particular advantage is required for all embodiments. One advantage is that Schottky diodes are coupled between word lines and transistors of OTP memory cells. While an OTP memory cell is regarded as "non-selected" during a read operation, a word line coupled to the OTP memory cell may be supplied with a ground voltage level. However, a bit line coupled to the OTP memory cell may have a higher voltage level than the ground voltage level, which will result in a reverse bias to the transistor in the OTP memory cell. Because a Schottky diode is coupled between the word line and the transistor of the OTP memory cell, the reverse leakage current can be blocked by the Schottky diode, which in turn will improve the device performance.

In some embodiments of the present disclosure, a memory device includes a substrate, a first gate structure and a second gate structure, first, second, third source/drain structures, a plurality of gate spacers, a first via and a second via, and a semiconductor layer. The first gate structure and the second gate structure are over the substrate. The first, second, third source/drain structures are over the substrate, in which the first and second source/drain structures are on opposite sides of the first gate structure, the second and third source/drain structures are on opposite sides of the second gate structure. The gate spacers are on opposite sidewalls of the first and second gate structures. The first via and the second via are over the first gate structure and the second gate structure, respectively, in which the first via is in contact with the first gate structure. The semiconductor layer is between the second via and the second gate structure.

In some embodiments of the present disclosure, a memory device includes a substrate, a first gate structure and a second gate structure, first, second, third source/drain structures, a plurality of gate spacers, a first via and a second via, a first word line and a second word line, and a bit line. The first gate structure and the second gate structure are over the substrate. The first, second, third source/drain structures are over the substrate, in which the first and second source/drain structures are on opposite sides of the first gate structure, the second and third source/drain structures are on opposite sides of the second gate structure. The first via and the second via are over the first gate structure and a second gate structure, respectively, in which a bottom surface of the first via is lower than a bottom surface of the second via. The first word line and the second word line are over the first and second vias, respectively. The bit line is electrically coupled to the first source/drain structure.

In some embodiments of the present disclosure, a method includes forming first and second gate structures over a substrate; forming an interlayer dielectric (ILD) layer adjacent to the first and second gate structures; depositing in sequence a first etch stop layer, a first dielectric layer, a second etch stop layer, and a second dielectric layer over the first and second gate structures and the ILD layer; forming a first via extending through the first etch stop layer, the first dielectric layer, the second etch stop layer, and the second dielectric layer, and contacting the first gate structure; forming an opening in the first etch stop layer, the first dielectric layer, the second etch stop layer, and the second dielectric layer to expose the second gate structure; forming a semiconductor layer to fill a lower portion of the opening; and forming a second via to fill an upper portion of the opening and over the semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a substrate;
a first gate structure and a second gate structure over the substrate;
first, second, third source/drain structures over the substrate, wherein the first and second source/drain structures are on opposite sides of the first gate structure, the second and third source/drain structures are on opposite sides of the second gate structure;
a plurality of gate spacers on opposite sidewalls of the first and second gate structures;
a first via and a second via over the first gate structure and a second gate structure, respectively, wherein the first via is in contact with the first gate structure; and
a semiconductor layer between the second via and the second gate structure, wherein the semiconductor layer and the second via form a Schottky diode.

2. The memory device of claim 1, further comprising:
a first word line electrically coupled to the first via; and
a second word line electrically coupled to the second via.

3. The memory device of claim 2, further comprising a bit line electrically coupled to the first source/drain structure.

4. The memory device of claim 1, further comprising an etching stop layer over the first and second gate structures, wherein a bottom surface of the first via is lower than a top surface of the etching stop layer, and a bottom surface of the second via is higher than the top surface of the etching stop layer.

5. The memory device of claim 1, wherein the semiconductor layer is made of silicon.

6. The memory device of claim 1, wherein the semiconductor layer is wider than the second gate structure.

7. The memory device of claim 6, wherein the semiconductor layer is in contact with the gate spacers on opposite sidewalls of the second gate structures.

8. The memory device of claim 1, wherein a bottom surface of the semiconductor layer is lower than top surfaces of the gate spacers.

9. The memory device of claim 1, wherein the first via has a greater height than the second via.

10. A memory device, comprising:
a substrate;
a first gate structure and a second gate structure over the substrate;
first, second, third source/drain structures over the substrate, wherein the first and second source/drain structures are on opposite sides of the first gate structure, the second and third source/drain structures are on opposite sides of the second gate structure;

a first via and a second via over the first gate structure and a second gate structure, respectively, wherein the first via is in contact with the first gate structure, and the second via is separated from the second gate structure;

a first word line and a second word line over the first and second vias, respectively; and a bit line electrically coupled to the first source/drain structure.

11. The memory device of claim 10, further comprising a semiconductor layer between the second via and the second gate structure.

12. The memory device of claim 11, further comprising gate spacers on opposite sidewalls of the second gate structure, wherein the semiconductor layer is in contact with a top surface of the second gate structure.

13. The memory device of claim 12, wherein the semiconductor layer is in contact with sidewalls of the gate spacers.

14. The memory device of claim 11, wherein a current path between the first word line and the first gate structure is free of a material of the semiconductor layer.

15. The memory device of claim 10, further comprising:
a first etch stop layer over the first and second gate structure;
a first dielectric layer over the first etch stop layer;
a second etch stop layer over the first dielectric layer; and
a second dielectric layer over the second etch stop layer, wherein,
the first via extends through the first etch stop layer, the first dielectric layer, the second etch stop layer, and the second dielectric layer; and
the second via extends through the first dielectric layer, the second etch stop layer, and the second dielectric layer, and does not extend through the first etch stop layer.

16. The memory device of claim 15, further comprising:
a source/drain contact extending through the first dielectric layer and the first etch stop layer and contacting the first source/drain structure; and
a third via extending through the second dielectric layer and the second etch stop layer and contacting the contacting the source/drain contact and the bit line.

17. A method, comprising:
forming first and second gate structures over a substrate;
forming an interlayer dielectric (ILD) layer adjacent to the first and second gate structures;
depositing in sequence a first etch stop layer, a first dielectric layer, a second etch stop layer, and a second dielectric layer over the first and second gate structures and the ILD layer;
forming a first via extending through the first etch stop layer, the first dielectric layer, the second etch stop layer, and the second dielectric layer, and contacting the first gate structure;
forming an opening in the first etch stop layer, the first dielectric layer, the second etch stop layer, and the second dielectric layer to expose the second gate structure;
forming a semiconductor layer to fill a lower portion of the opening; and
forming a second via to fill an upper portion of the opening and over the semiconductor layer, wherein the second via and the semiconductor layer form a Schottky diode.

18. The method of claim 17, wherein forming the opening comprises:
forming a patterned mask over the second dielectric layer;
etching the first etch stop layer, the first dielectric layer, the second etch stop layer, and the second dielectric layer using the patterned mask as an etch mask; and
removing the patterned mask prior to forming the semiconductor layer.

19. The method of claim 17, further comprising:
prior to depositing the second etch stop layer, forming a source/drain contact extending through the first etch stop layer and the first dielectric layer, and contacting a source/drain structure over the substrate; and
forming a third via extending through the second etch stop layer and the second dielectric layer, and contacting the source/drain contact.

20. The method of claim 19, wherein forming the opening in the first etch stop layer, the first dielectric layer, the second etch stop layer, and the second dielectric layer comprises etching the second gate structure such that a top surface of the second gate structure is lowered.

* * * * *